(12) United States Patent
Shoeb et al.

(10) Patent No.: US 11,011,351 B2
(45) Date of Patent: May 18, 2021

(54) MONOENERGETIC ION GENERATION FOR CONTROLLED ETCH

(71) Applicant: Lam Research Corporation, Fremont, CA (US)

(72) Inventors: Juline Shoeb, Fremont, CA (US); Alexander Miller Paterson, San Jose, CA (US); Ying Wu, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 40 days.

(21) Appl. No.: 16/035,423

(22) Filed: Jul. 13, 2018

(65) Prior Publication Data
US 2020/0020510 A1 Jan. 16, 2020

(51) Int. Cl.
*H01L 21/3065* (2006.01)
*H01J 37/32* (2006.01)
*H01L 21/67* (2006.01)

(52) U.S. Cl.
CPC .... *H01J 37/32183* (2013.01); *H01L 21/3065* (2013.01); *H01L 21/67069* (2013.01); *H01J 37/32091* (2013.01); *H01J 2237/334* (2013.01)

(58) Field of Classification Search
CPC .......... H01L 21/3065; H01L 21/31116
See application file for complete search history.

(56) References Cited

U.S. PATENT DOCUMENTS

| | | | |
|---|---|---|---|
| 5,409,562 A | 4/1995 | Kumihashi et al. | |
| 7,456,110 B2 | 11/2008 | Lansford et al. | |
| 9,171,699 B2 | 10/2015 | Valcore, Jr. et al. | |
| 9,197,196 B2 | 11/2015 | Valcore, Jr. et al. | |
| 9,390,893 B2 | 7/2016 | Valcore, Jr. et al. | |
| 9,460,894 B2 | 10/2016 | Lill et al. | |
| 9,462,672 B2 | 10/2016 | Valcore, Jr. et al. | |
| 9,536,749 B2 | 1/2017 | Marakhtanov et al. | |
| 9,607,810 B2 | 3/2017 | Valcore, Jr. et al. | |
| 9,761,414 B2 | 9/2017 | Marakhtanov et al. | |
| 9,812,294 B2 | 11/2017 | Valcore, Jr. et al. | |
| 9,960,015 B2 | 5/2018 | Valcore, Jr. et al. | |
| 9,997,333 B2 | 6/2018 | Valcore, Jr. et al. | |
| 2004/0219737 A1* | 11/2004 | Quon | H01J 37/321 438/222 |
| 2006/0131271 A1 | 6/2006 | Kiermasz et al. | |
| 2010/0267242 A1 | 10/2010 | Lebouitz et al. | |
| 2013/0119018 A1* | 5/2013 | Kanarik | H05H 1/46 216/67 |
| 2014/0305589 A1 | 10/2014 | Valcore, Jr. | |
| 2015/0371869 A1* | 12/2015 | Surla | H01L 21/31127 438/723 |

(Continued)

OTHER PUBLICATIONS

ISR, PCT(US2019/041399, dated Nov. 11, 2019, 3 pages.

*Primary Examiner* — Thomas T Pham
(74) *Attorney, Agent, or Firm* — Penilla IP, APC

(57) ABSTRACT

Systems and methods for generating monoenergetic ions are described. A duty cycle of a high parameter level of a multistate parameter signal is maintained and a difference between the high parameter level and a low parameter level of the multistate parameter signal is maintained to generate monoenergetic ions. The monoenergetic ions are used to etch a top material layer of a substrate at a rate that is self-limiting without substantially etching a bottom material layer of the substrate.

13 Claims, 8 Drawing Sheets

(56) References Cited

U.S. PATENT DOCUMENTS

| | | |
|---|---|---|
| 2016/0268100 A1 | 9/2016 | Valcore, Jr. et al. |
| 2017/0084429 A1 | 3/2017 | Marakhtanov et al. |
| 2018/0330944 A1 | 11/2018 | Ruffell et al. |
| 2019/0228950 A1* | 7/2019 | Funk .................. H01L 21/3065 |

* cited by examiner

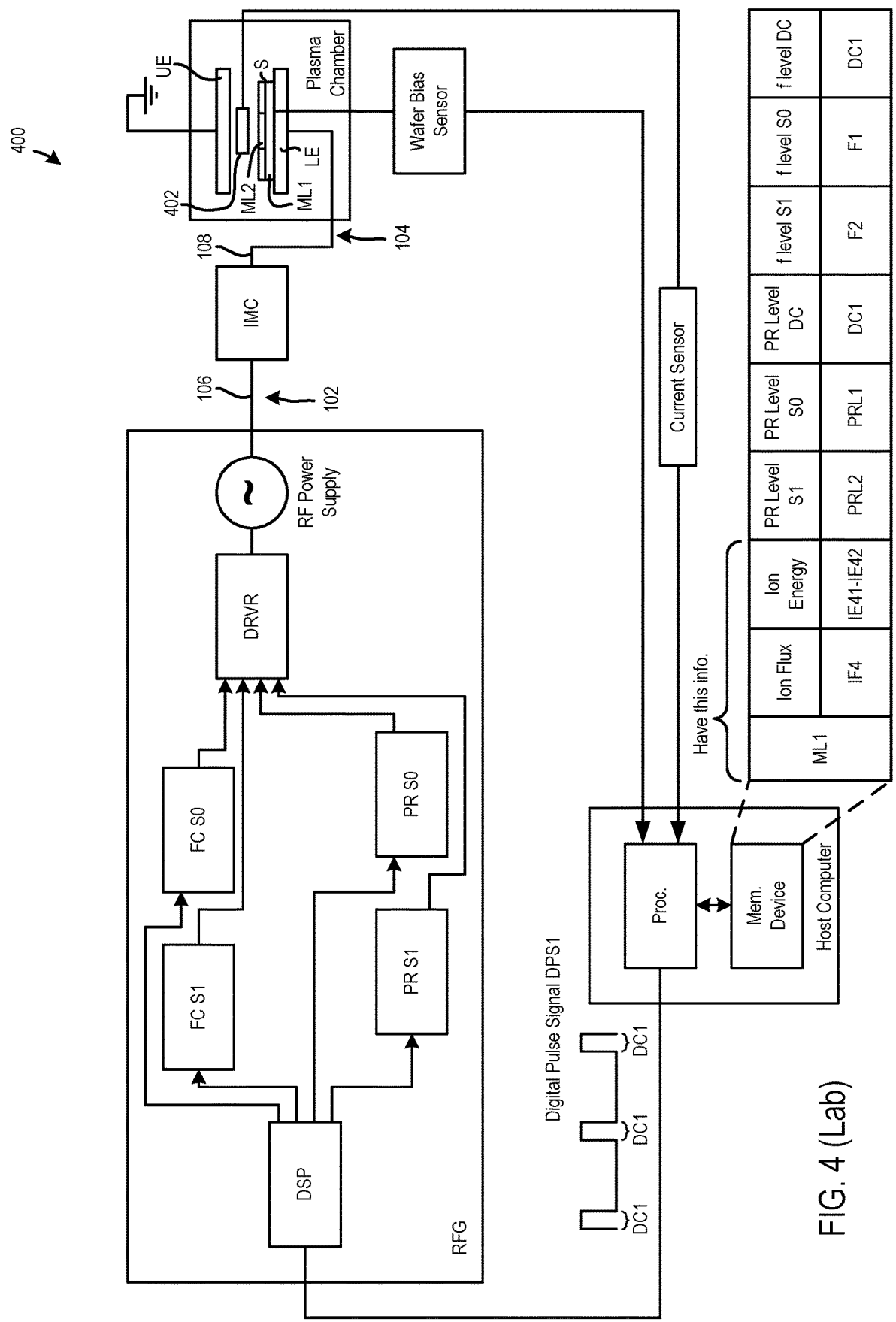
FIG. 4 (Lab)

MONOENERGETIC ION GENERATION FOR CONTROLLED ETCH

FIELD

The present embodiments relate to systems and methods for generation of monoenergetic ions for performing a controlled etching operation.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A plasma tool includes a radio frequency generator, a match, and a plasma chamber. The radio frequency generator is coupled to the match, which is coupled to the plasma chamber. A semiconductor wafer is placed within the plasma chamber for being processed. The radio frequency generator generates a radio frequency signal, which is supplied via the match to the plasma chamber to process the semiconductor wafer. The radio frequency signal creates ions of plasma within the plasma chamber. These ions act on the wafer to process the wafer.

It is in this context that embodiments described in the present disclosure arise.

SUMMARY

Embodiments of the disclosure provide systems, apparatuses, methods and computer programs for generating monoenergetic ions to perform a controlled etching operation. It should be appreciated that the present embodiments can be implemented in numerous ways, e.g., a process, an apparatus, a system, a device, or a method on a computer readable medium. Several embodiments are described below.

Ion beams of plasma ions, direct current (DC) sources, or tailored waveforms are used to process a substrate. The ion beams diverge due to positive charge repulsion between ions of plasma to increase an angular spread of the ions. The increased angular spread decreases an etch rate of etching the substrate and decreases directionality of an etched feature. The DC sources have a high reactance and produce a low amount of current. The low amount of current reduces the etch rate. Moreover, when the DC sources are used to process the substrate, the angular spread of ions of plasma is difficult to optimize. The tailored waveforms also have a high angular spread of ions and do not produce an expected etch profile across a surface of the substrate.

In various embodiments, the systems and methods described herein generate ions of plasma with monoenergy that etches a material layer of a substrate and preserves one or more other material layers of the substrate. The monoenergetic ions of plasma are generated using level-to-level voltage pulsing and/or level-to-level frequency pulsing where voltage levels or frequency levels or a duty cycle of the voltage levels, or a duty cycle of the frequency levels are tuned to generate the monoenergetic ions. The monoenergetic ions achieve the expected etch rate profile, increase the etch rate, and increase selectivity.

In some embodiments, the methods described herein include adjusting voltage levels and adjusting a duty cycle of the voltage levels. For example, a higher one of the voltage levels is maintained at a low duty cycle, such as approximately 25% or lower, and a lower one of the voltage levels is maintained at a higher duty cycle, such as approximately 75% or higher. Also, in the example, the lower voltage level is less than 25% of the higher voltage level. To illustrate, all magnitudes of the lower voltage level are less than approximately 25% of any magnitude of the higher voltage level and all magnitudes of the higher voltage level are greater than approximately 400% of any magnitude of the lower voltage level. During a state in which the higher voltage level is sustained, there is a voltage spike experienced by a plasma sheath of plasma due to a small duty cycle of the higher voltage level and there is insufficient time to completely charge the plasma sheath to generate high energy ions. The voltage spike is of a short duration and is relatively high in that the voltage spike is at the higher voltage level. The short duration voltage spike is followed by a discharge of this relatively high voltage spike to a stable low voltage level of the plasma sheath since the lower voltage level is operated with the higher duty cycle. The discharge to the lower voltage level after the voltage spike produces ions of plasma that respond to this low average sheath voltage of the plasma sheath. Because of the low average sheath voltage, ions of plasma have less swing in their energy and are mostly monoenergetic and energetic enough to etch a desired material.

In a variety of embodiments, a method is described. The method includes receiving a substrate in a plasma chamber for etching. The substrate has a first material layer and a second material layer. The first material layer is disposed over the second material layer. The method further includes identifying a first energy band optimized for etching the first material layer. The first energy band is distinct from a second energy band optimized for etching the second material layer. The first energy band is used to etch the first material layer at a rate that is self-limiting to the second material layer so as to not substantially etch the second material layer. The method includes generating a pulsed radio frequency (RF) signal that pulses between a high parameter level and a low parameter level. The pulsed RF signal has a duty cycle. The pulsed RF signal pulses between the high parameter level and the low parameter level and has the duty cycle to generate plasma ions with the first energy band.

In several embodiments, a system is described. The system includes a plasma chamber has a slot for receiving a substrate to be etched. The substrate has a first material layer and a second material layer. The first material layer is disposed over the second material layer. The system includes a host computer used to identify a first energy band optimized for etching the first material layer. The first energy band is distinct from a second energy band optimized for etching the second material layer. The first energy band is used to etch the first material layer at a rate that is self-limiting to the second material layer so as to not substantially etch the second material layer. The system further includes an RF generator coupled to the host computer. The RF generator is used to generate a pulsed RF signal that pulses between a high parameter level and a low parameter level. The pulsed RF signal has a duty cycle. The pulsed RF signal pulses between the high parameter level and the low parameter level and has the duty cycle to generate plasma ions with the first energy band. The system further includes an impedance matching circuit. The impedance matching circuit receives the RF pulsed signal and outputs a modified RF signal. The plasma chamber receives the modified RF signal and, in response, etches the first material layer at the rate without substantially etching the second material layer.

In various embodiments, a controller is described. The controller includes a processor. The processor is configured to identify a first energy band optimized for etching a first material layer of a substrate to be placed within a plasma chamber for processing. The first energy band is distinct from a second energy band optimized for etching a second material layer of the substrate. The first material layer is disposed over the second material layer. The first energy band is used to etch the first material layer at a rate that is self-limiting to the second material layer so as to not substantially etch the second material layer. The processor is used to control an RF generator to generate a pulsed RF signal that pulses between a high parameter level and a low parameter level. The pulsed RF signal has a duty cycle. The pulsed RF signal pulses between the high parameter level and the low parameter level and has the duty cycle to generate plasma ions with the first energy band. The controller includes a memory device coupled to the processor for storing respective information associated with the first material layer and the second material layer, the first energy band, the second energy band, the high parameter level, the low parameter level, and the duty cycle.

Several advantages of the herein described systems and methods include reducing a time period for which a high parameter level, such as the higher voltage level, is sustained compared to a time period for which a low parameter level, such as the lower voltage level, is sustained. Moreover, at least a predetermined amount of difference is maintained between the high parameter level and the low parameter level. By reducing the time period and by maintaining at least the predetermined amount of difference, a large number of monoenergetic ions of plasma are generated within a plasma chamber. The monoenergetic ions are used to etch a top material layer of the substrate without substantially etching a bottom material layer of the substrate. The monoenergetic ions increase selectivity of the top material layer compared to the bottom material layer and increase an etch rate of etching the top material layer.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 4 is a diagram of an embodiment of a system to illustrate identification of multiple parameter levels and multiple frequency levels for which monoenergetic ions of plasma within a plasma chamber are generated for etching the first material layer without substantially etching the second material layer.

DETAILED DESCRIPTION

The following embodiments describe systems and methods for generating monoenergetic ions to perform a controlled etching operation. It will be apparent that the present embodiments may be practiced without some or all of these specific details. In other instances, well known process operations have not been described in detail in order not to unnecessarily obscure the present embodiments.

Figure 1:
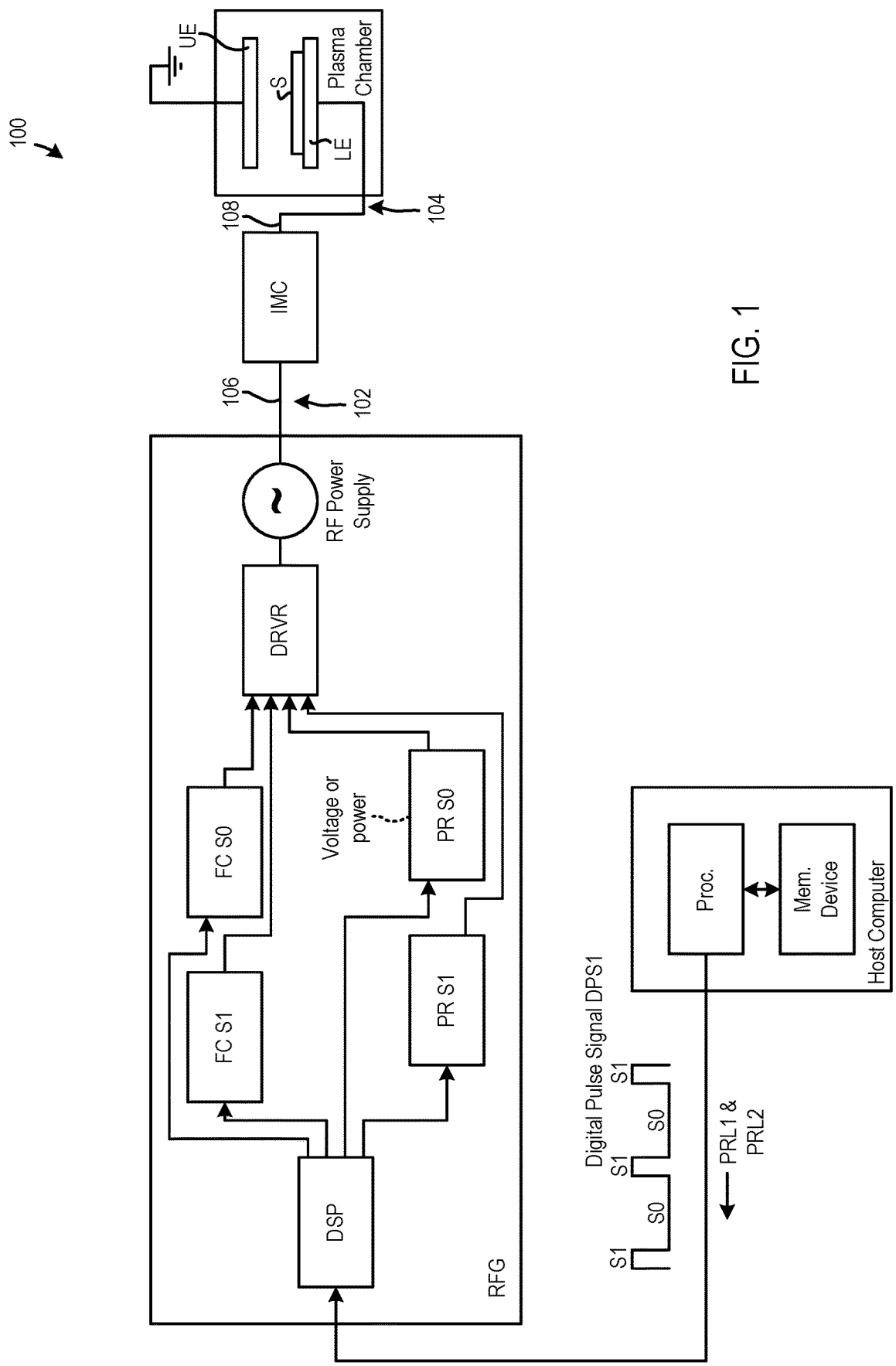
FIG. 1 is a diagram of an embodiment of a system to illustrate multilevel parameter and frequency pulsing for generation of monoenergetic ions.

FIG. 1 is a diagram of an embodiment of a system 100 to illustrate multilevel parameter and frequency pulsing for generation of monoenergetic ions. An example of the parameter, as used herein, is voltage or power. The system 100 includes an RF generator RFG, a host computer, an impedance matching circuit IMC, and a plasma chamber. An example of the plasma chamber includes a capacitively coupled plasma (CCP) chamber. An input of impedance matching circuit is coupled to the RF generator via an RF cable 106 and an output of impedance matching circuit is coupled to a lower electrode LE of the plasma chamber via an RF transmission line 108.

An example of the RF generator is a generator that has a frequency of operation in kilohertz (kHz). To illustrate, the RF generator operates at a frequency of 200 kHz or 400 kHz. Another example of the RF generator is a generator that has a frequency of operation in megahertz (MHz). To illustrate, the RF generator operates at a frequency of 2 MHz, 13.56 MHz, 27 MHz, or 60 MHz.

Examples of the host computer include a desktop computer, a controller, a tablet, a server, a laptop computer, and a smart phone, etc. The host computer includes a processor and a memory device. The processor is coupled to the memory device. As used herein, in some embodiments, a processor is an application specific integrated circuit (ASIC), or a programmable logic device (PLD), or a central processing unit (CPU), or a microprocessor, or a microcontroller. Similarly, as used herein, in various embodiments, a digital signal processor is an ASIC, or a PLD, or a CPU, or a microprocessor, or a microcontroller. Also, as used herein, in various embodiments, a controller includes a memory device and an ASIC, or a PLD, or a CPU, or a microprocessor. In the controller, the ASIC, or the PLD, or the CPU, or the microprocessor is coupled to the memory device. As an example, the controller is a microcontroller. Examples of a memory device include a random access memory (RAM) and a read-only memory (ROM). To illustrate, a memory device is a flash memory, a hard disk, or a storage device, etc. A memory device is an example of a computer-readable medium.

An impedance matching circuit, as described herein, is a network of one or more components, such as one or more resistors, or one or more capacitors, or one or more inductors, or a combination thereof, that match an impedance of a load coupled to an output of the impedance matching circuit with an impedance of a source coupled to an input of the impedance matching circuit. Two or more of the components are coupled to each other in a parallel or serial manner Examples of the load coupled to an output of impedance matching circuit include the plasma chamber and the RF transmission line 108. Moreover, examples of the source coupled to an input of the impedance matching circuit include the RF cable 106 and the RF generator.

The plasma chamber includes an upper electrode UE and the lower electrode. The lower electrode is embedded within a substrate support, such as a chuck, on which a substrate S, such as a semiconductor wafer, is placed. The chuck faces the upper electrode. The upper electrode is coupled to a ground potential. Each of the lower electrode and the upper electrode is made from a metal, such as aluminum or an alloy of aluminum.

The RF generator includes a digital signal processor DSP, a frequency controller FCS1, another frequency controller FCS0, a parameter controller PRS1, another parameter controller PRS0, a driver system DRVR, and an RF power supply. As used herein, a controller is ASIC, or a PLD, or a CPU, or a microprocessor, or a microcontroller, or a microprocessor that is coupled to a memory. An example of the driver system, as used herein, includes one or more transistors. Another example of the driver system, as used herein, includes one or more transistors that are coupled to an amplifier. An example of the RF power supply, as used herein, include an RF oscillator that generates a sinusoidal signal at a radio frequency, such as, one ranging from and including 200 kHz to 100 MHz. The RF power supply is coupled to the RF cable 106.

The digital signal processor is coupled to the parameter controllers PRS1 and PRS0 and to the frequency controllers FCS1 and FCS0. Each of the parameter controllers PRS1 and PRS0 and the frequency controllers FCS1 and FCS0 is coupled to the driver system and the driver system is coupled to the RF power supply. The processor of the host computer is coupled to the digital signal processor of the RF generator via a transfer network, such as, a transfer cable, a computer network, the Internet, or an Intranet. Examples of a transfer cable, as used herein, include a parallel transfer cable that transfers data in a parallel manner, a serial transfer cable that transfers data in a serial manner, or a universal serial bus (USB) cable.

A substrate, as described herein, is used to make one or more semiconductor chips, which are used in one or more electronic devices, such as a cell phone, or a tablet, or a processor, or a memory device, or a television, or a device that applies artificial intelligence, or a device which is a part of Internet of things (IoT).

The processor of the host computer generates and sends a digital pulse signal DPS1 via the transfer network to the digital signal processor of the RF generator. The digital pulse signal DPS1 has multiple states S1 and S0 and transitions periodically between the states S1 and S0. An example of the state S1 is a high state, an on state, or a logic level 1. An example of the state S0 is a low state, an off state, or a logic level 0. It should be noted that a time period of an occurrence of the state S1 is less than a time period of the occurrence of the state S0. For example, a duty cycle of the digital pulse signal DPS1 is less than approximately 50%, such is 50% or within a statistical range from 50% or between 0 and 50%. To illustrate, the occurrence of the state S1 of the digital pulse signal DPS1 is for a time period that is approximately 25% of a total time period of a clock cycle, such as a clock cycle C1 or a clock cycle C2, described below, in which an occurrence of the state S1 takes place and an occurrence of the state S0 of the digital pulse signal DPS1 takes place. In this illustration, the occurrence of the state S0 is consecutive to the occurrence of the state S1.

As used herein, a statistical range is a predetermined range, or a variance, or a standard deviation. For example, the statistical range from the duty cycle of 50% of the digital pulse signal DPS1 is a standard deviation in a transition of the digital pulse signal DPS1 from the state S1 to the state S0. An example of a predetermined range is a range from 0 to 5%. To illustrate, a transition from the state S1 to the state S0 of the digital pulse signal DPS1 occurs within zero to 5% of half of the clock cycle. Examples of the time period that is approximately 25% of the clock cycle in which the occurrence of the state S1 of the digital pulse signal DPS1 takes place and the occurrence of the state S0 of the digital pulse signal DPS1 takes place include the time period that is 25% of the clock cycle and a time period that is within the statistical range from 25% of the clock cycle. As another illustration, the occurrence of the state S1 of the digital pulse signal DPS1 is for a time period that is approximately 10% of the total time period of the clock cycle in which an occurrence of the state S1 takes place and an occurrence of the state S0 of the digital pulse signal DPS1 takes place. In this illustration, the occurrence of the state S0 is consecutive to the occurrence of the state S1. Examples of the time period that is approximately 10% of the clock cycle in which the occurrence of the state S1 of the digital pulse signal DPS1 takes place and the occurrence of the state S0 of the digital pulse signal DPS1 takes place include the time period that is 10% of the clock cycle and a time period that is within the statistical range from 10% of the clock cycle.

In addition, the processor of the host computer sends a parameter level PRL1 of an RF signal 102 to be generated by the RF generator and a parameter level PRL2 of the RF signal 102. The parameter level PRL2 is to be generated during the state S1 and the parameter level PRL1 is to be generated during the state S0. The parameter levels PRL1 and PRL2 are identified by the processor of the host computer from the memory device of the host computer. Moreover, the processor of the host computer sends a frequency level F1 of the RF signal 102 and a frequency level F2 of the RF signal 102. The frequency level F2 is to be generated during the state S1 and the frequency level F1 is to be generated during the state S0. The frequency levels F1 and F2 are identified by the processor of the host computer from the memory device of the host computer. Upon receiving the parameter levels PRL1 and PRL2, and the frequency levels F1 and F2, the digital signal processor of the RF generator sends the parameter level PRL1 to the parameter controller PRS0 for storage in a memory device of the parameter controller PRS0, sends the parameter level PRL2 to the parameter controller PRS1 for storage in a memory device of the parameter controller PRS1, sends the frequency level F1 to the frequency controller FCS0 for storage in a memory device of the frequency controller FCS0, and sends the frequency level F2 to the frequency controller FCS1 for storage in a memory device of the frequency controller FCS1.

The digital signal processor of the RF generator determines whether the digital pulse signal DPS1 has the state S1 or S0. For example, the digital signal processor determines whether a logic level of the digital pulse signal DPS1 is greater or lower than a predetermined threshold. Upon determining that the logic level of the digital pulse signal DPS1 is greater than the predetermined threshold, the digital signal processor identifies the occurrence of the state of the digital pulse signal DPS1 to be S1. On the other hand, upon determining that the logic level of the digital pulse signal DPS1 is less than the predetermined threshold, the digital signal processor identifies the occurrence of the state of the digital pulse signal DPS1 to be S0. As another example, the digital signal processor determines whether the logic level of the digital pulse signal DPS1 is zero or one. Upon determining that the logic level of the digital pulse signal DPS1 is one, the digital signal processor identifies the occurrence of the state of the digital pulse signal 136 to be S1 and upon determining that the logic level of the digital pulse signal DPS1 is zero, the digital signal processor identifies the occurrence of the state of the digital pulse signal 136 to be S0.

During a time period in which the digital pulse signal DPS1 has an occurrence of the state S1, the digital signal processor sends a signal indicating the state S1 to each of the parameter controller PRS1 and the frequency controller FCS1. Moreover, during a time period in which the digital pulse signal DPS1 has an occurrence of the state S0, the digital signal processor sends a signal indicating the state S0 to each of the parameter controller PRS0 and the frequency controller FCS0.

Moreover, during the time period in which the digital pulse signal DPS1 has an occurrence of the state S1, upon receiving the signal indicating the state S1, the parameter controller PRS1 accesses the parameter level PRL2 from the memory device of the parameter controller PRS1 and sends the parameter level PRL2 to the driver system of the RF generator. Similarly, during the time period in which the digital pulse signal DPS1 has an occurrence of the state S1, upon receiving the signal indicating the state S1, the frequency controller FCS1 accesses the frequency level F2 from the memory device of the frequency controller FCS1 and sends the frequency level F2 to the driver system of the RF generator.

Furthermore, during the time period in which the digital pulse signal DPS1 has an occurrence of the state S0, upon receiving the signal indicating the state S0, the parameter controller PRS0 accesses the parameter level PRL1 from the memory device of the parameter controller PRS0 and sends the parameter level PRL1 to the driver system of the RF generator. Similarly, during the time period in which the digital pulse signal DPS1 has an occurrence of the state S0, upon receiving the signal indicating the state S0, the frequency controller FCS0 accesses the frequency level F1 from the memory device of the frequency controller FCS0 and sends the frequency level F1 to the driver system of the RF generator.

During the time period in which the digital pulse signal DPS1 has an occurrence of the state S1, the driver system of the RF generator receives the parameter level PRL2 and the frequency level F2 and generates a current signal based on the parameter level PRL2 and the frequency level F2, and provides the current signal to the RF power supply. Also, during the time period in which the digital pulse signal DPS1 has an occurrence of the state S1, the RF power supply generates a portion of the RF signal 102 upon receiving the current signal from the driver system. The portion of the RF signal 102 has the parameter level PRL2 and the frequency level F2 during the occurrence of the state S1 of the digital pulse signal DPS1.

Similarly, during the time period in which the digital pulse signal DPS1 has an occurrence of the state S0, the driver system of the RF generator receives the parameter level PRL1 and the frequency level F1 and generates a current signal based on the parameter level PRL1 and the frequency level F1, and provides the current signal to the RF power supply. Also, during the time period in which the digital pulse signal DPS1 has an occurrence of the state S0, the RF power supply generates a portion of the RF signal 102 upon receiving the current signal from the driver system. The portion of the RF signal 102 has the parameter level PRL1 and the frequency level F1 during the occurrence of the state S0 of the digital pulse signal DPS1.

The impedance matching circuit receives the RF signal 102 to via the RF cable 106 and matches an impedance of the load coupled to the output of the impedance matching circuit with that of the source coupled to the input of the impedance matching circuit to generate a modified RF signal 104. The modified RF signal 104 is supplied from the output of the impedance matching circuit to the lower electrode.

When one or more process gases are supplied to the plasma chamber in addition to supplying the modified RF signal 104, plasma is stricken or maintained within the plasma chamber to process the substrate S. Examples of the one or more process gases include an oxygen-containing gas, such as $O_2$. Other examples of the one or more process gases include a fluorine-containing gas, e.g., tetrafluoromethane ($CF_4$), sulfur hexafluoride ($SF_6$), hexafluoroethane ($C_2F_6$), etc. Examples of processing a substrate, as described herein, include depositing a material on the substrate, etching the substrate, cleaning the substrate, and sputtering the substrate.

By generating the RF signal 102 having the parameter level PRL2 and the frequency level F2 during the occurrence of the state S1 of the digital pulse signal DPS1 and having the parameter level PRL1 and the frequency level F1 during the occurrence of the state S0 of the digital pulse signal DPS1, monoenergetic ions of the plasma within the plasma chamber are generated for processing the substrate S. It should be noted that the time period of the occurrence of the state S1 is less than the time period of the occurrence of the state S0. The monoenergetic ions etch a top layer of the substrate S at a rate that is self-limiting without substantially etching a bottom layer of the substrate S. The top layer of the substrate S is above and adjacent to the bottom layer of the substrate S.

In some embodiments, any number of RF generators are coupled to the impedance matching circuit. For example, an additional RF generator is coupled to another input of impedance matching circuit via another RF cable to generate and send an RF signal to the other input of impedance matching circuit.

In various embodiments, instead of the upper electrode being coupled to the ground potential, the lower electrode is coupled to the ground potential and the upper electrode is coupled to the RF transmission line 108.

In several embodiments, instead of being identified by the processor of the host computer system, the parameter levels PRL1 and PRL2 are received from a user via an input device, such as a keyboard or a mouse or stylus, that is coupled to the processor of the host computer system via an input/output interface. Similarly, in some embodiments, instead of being identified by the processor of the host computer system, the frequency levels F1 and F2 are received from a user via the input device.

In some embodiments, each parameter level, described herein, of an RF signal, is an envelope of the RF signal. For example, a parameter level, described herein, of an RF signal is a zero-to-peak magnitude of the RF signal or a peak-to-peak magnitude of the RF signal.

Also, in various embodiments, a parameter level of an RF signal includes one or more magnitudes, such as amplitudes or values, of the parameter of the RF signal and the one or more magnitudes are exclusive of one or more magnitudes of another parameter level of the parameter of the RF signal. For example, the parameter level PRL1 has one or more values, none of which are the same as one or more values of the parameter level PRL2.

Similarly, in some embodiments, a frequency level of an RF signal includes one or more magnitudes, such as amplitudes or values, of the frequency of the RF signal and the one or more magnitudes are exclusive of one or more magnitudes of another frequency level of the frequency of the RF signal. For example, the frequency level F1 has one or more values, none of which are the same as one or more values of the frequency level F2.

In various embodiments, instead of the multiple frequency controllers FCS1 and FCS0, one frequency controller is used to control the RF power supply to generate a single frequency level of an RF signal instead of the multiple frequency levels F1 and F2. The single frequency level includes one or more values of frequency of the RF signal. The single frequency level represents is a continuous wave of frequency. The processor of the host computer sends a value of the single frequency level of the RF signal to the digital signal processor of the RF generator. Upon receiving the value of the single frequency level, regardless of whether the state of the digital pulse signal DPS1 is S1 or S0, the digital signal processor sends the value to the frequency controller for storage in a memory device of the frequency controller. Moreover, upon receiving the value of the single frequency level, regardless of whether the state of the digital pulse signal DPS1 is S1 or S0, the frequency controller sends the value to the driver system. The driver system generates a current signal based on the value of the single frequency level and provides the current to the RF power supply. Upon receiving the current signal, the RF power supply generates the RF signal having the single frequency level and the multiple parameter levels PRL1 and PRL2.

Figure 2:
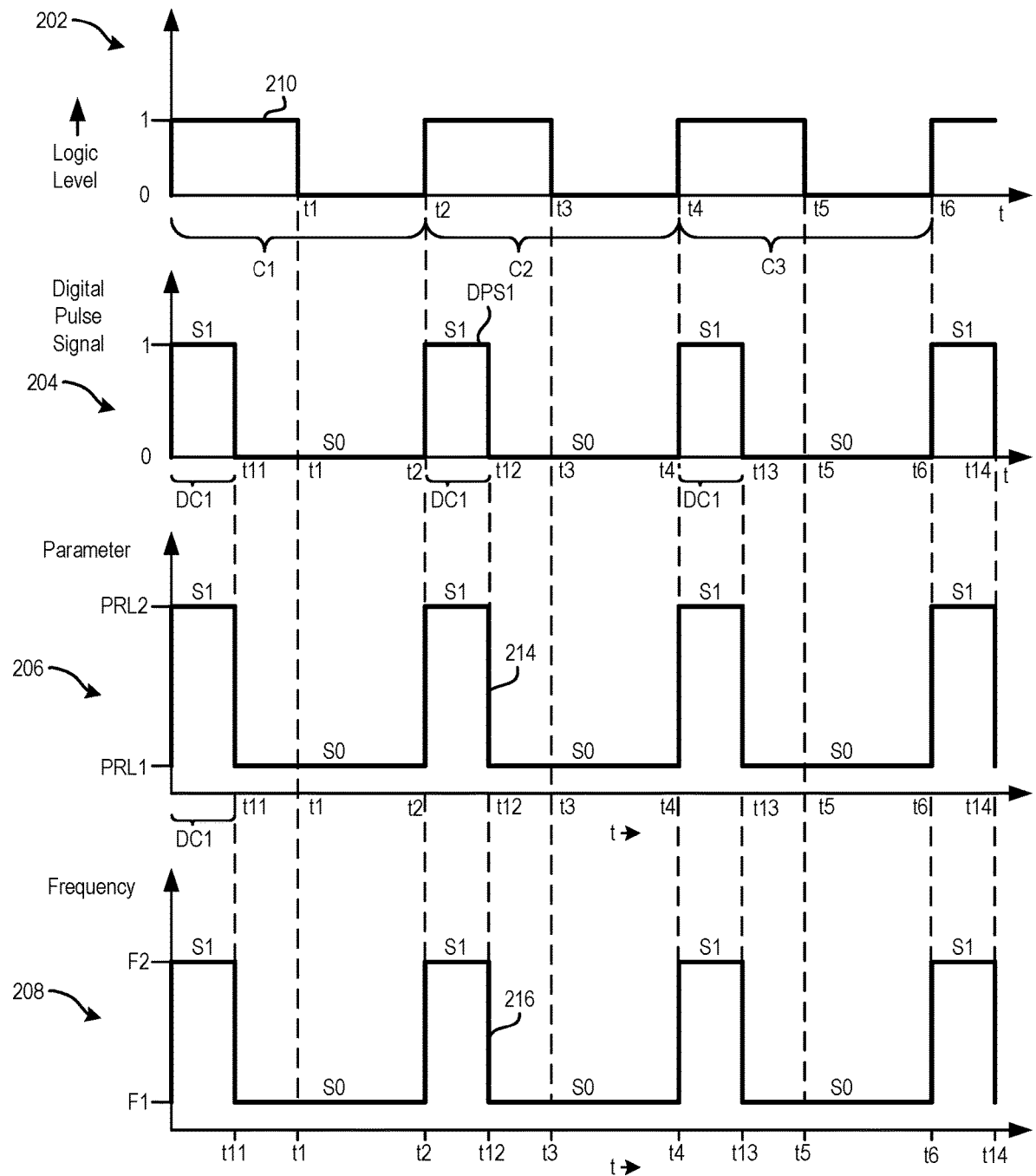
FIG. 2 shows embodiments of graphs to illustrate a digital pulse signal, a multilevel parameter signal, and a multilevel frequency signal.

FIG. 2 shows embodiments of graphs 202, 204, 206, and 208 to illustrate a clock signal 210, the digital pulse signal DPS1, a parameter 214 of the RF signal 102 of FIG. 1, and a frequency 216 of the RF signal 102. The graph 202 plots a logic level of the clock signal 210 having the clock cycle, such as C1, versus time t. The clock signal 210 is an example of the clock signal, mentioned above. The clock signal 210 is generated by the processor of the host computer of FIG. 1. The clock signal 210 periodically transitions between the logic level 1 and the logic level 0. For example, the clock signal 210 has the logic level 1 for a time period between a time t1 and a time 0 of the clock cycle C1. The clock cycle C1 starts at the time 0. The clock signal 210 transitions from the logic level 1 to the logic level 0 at the time t1. The logic level 0 occurs for a time period between the time t1 and a time t2 of the clock cycle C1. The clock signal 210 further transitions from the logic level 0 to the logic level 1 during the time t2 at which the clock cycle C1 ends. The clock signal 210 has the logic level 1 for a time period between the time t2 and a time t3 of the clock cycle C2. The clock cycle C2 starts at the time t2. The clock signal 210 transitions from the logic level 1 to the logic level 0 at the time t3. The logic level 0 occurs for a time period between the time t3 and a time t4 of the clock cycle C2. The clock signal 210 further transitions from the logic level 0 to the logic level 1 during the time t4 at which the clock cycle C2 ends. The clock signal 210 has the logic level 1 for a time period between the time t4 and a time t5 of a clock cycle C3. The clock cycle C3 starts at the time t4. The clock signal 210 transitions from the logic level 1 to the logic level 0 at the time t5. The logic level 0 occurs for a time period between the time t5 and a time t6 of the clock cycle C3. The clock signal 210 further transitions from the logic level 0 to the logic level 1 during the time t6 at which the clock cycle C3 ends.

The clock cycles, such as the clock cycles C1, C2, and C3, of the clock signal 210 repeat periodically. To illustrate, the time period between the times t2 and 0 is equal to the time period between the times t4 and t2 and is equal to the time period between the times t6 and t4.

The clock signal 210 has a duty cycle of 50%. For example, during each of the clock cycles C1, C2, and C3, a logic level of the clock signal 210 is one for half of the clock cycle and a logic level is zero for the remaining half of the clock cycle.

The graph 204 plots the digital pulse signal DPS1 versus the time t. The digital pulse signal DPS1 transitions from the state S0 to the state S1 at the time 0. The state S0 has the logic level 0 and the state S1 has the logic level 1. An occurrence of the state S1 has a duty cycle DC1, which is less than the duty cycle of the clock signal 210. For example, the digital pulse signal DPS1 has the state S1 during a time period between the time 0 and a time t11, which is less than the time t1. The digital pulse signal DPS1 transitions from the state S1 to the state S0 at the time t11 and remains and the state S0 for a time period between the time t11 and the time t2. The time period between the times t11 and t2 is greater than the time period between the times t1 and t2. The digital pulse signal DPS1 transitions at the time t2 from the state S0 to the state S1.

The digital pulse signal DPS1 has the state S1 during a time period between the time t2 and a time t12, which is less than the time period between the times t2 and t3. The digital pulse signal DPS1 transitions from the state S1 to the state S0 at the time t12 and remains and the state S0 for a time period between the time t12 and the time t4. The time period between the times t12 and t4 is greater than the time period between the times t3 and t4. The digital pulse signal DPS1 transitions at the time t4 from the state S0 to the state S1. Similarly, the digital pulse signal DPS1 has the state S1 for a time period between the time t4 and a time t13, has the state S0 for a time period between the time t13 and the time 6, and has the state S1 for a time period between the time t6 and t14.

It should be noted that during each cycle of the clock signal 210, there is another occurrence of a state of the digital pulse signal DPS1. For example, during the clock cycle C1, there is a first occurrence of the state S1 of the digital pulse signal DPS1 and a first occurrence of the state S0 of the digital pulse signal DPS1. Moreover, during the clock cycle C2, there is a second occurrence of the state S1 of the digital pulse signal DPS1 and a second occurrence of the state S0 of the digital pulse signal DPS1.

The graph 206 plots a parameter 214, such as a voltage or power, of the RF signal 102 of FIG. 1 versus the time t. At approximately the time 0, the parameter 214 of the RF signal 102 transitions from the parameter level PRL1 to the parameter level PRL2. The parameter 214 of the RF signal 102 has the parameter level PRL2 during the time period between the times t11 and 0. Moreover, at approximately the time t11, the parameter 214 of the RF signal 102 transitions from the parameter level PRL2 to the parameter level PRL1 and remains at the parameter level PRL1 during the time period between the times t11 and t2. For example, the RF signal 102 has the parameter level PRL1 for at least 75% of the clock cycle C1. To illustrate, the RF signal 102 has the parameter level PRL1 for the time period between the times t11 and t2 and the time period is 75% of a total time period between the times 0 and t2. Also, at approximately the time t2, the parameter 214 of the RF signal 102 transitions from the parameter level PRL1 to the parameter level PRL2 and remains at the parameter level PRL2 during the time period between the times t12 and t2. Furthermore, at approximately the time t12, the parameter 214 transitions from the parameter level PRL2 to the parameter level PRL1 and remains at the parameter level PRL1 during the time period between the times t12 and t4.

The graph 206 plots a frequency 216 of the RF signal 102 versus the time t. At approximately the time 0, the frequency 216 of the RF signal 102 transitions from the frequency level F1 to the frequency level F2. The frequency 216 of the RF signal 102 has the frequency level F2 during the time period between the times t11 and 0. Moreover, at approximately the time t11, the frequency 216 of the RF signal 102 transitions from the frequency level F2 to the frequency level F1 and remains at the frequency level F1 during the time period between the times t11 and t2. Also, at approximately the time t2, the frequency 216 of the RF signal 102 transitions from the frequency level F1 to the frequency level F2 and remains at the frequency level F2 during the time period between the times t12 and t2. Furthermore, at approximately the time t12, the frequency 216 transitions from the frequency level F2 to the frequency level F1 and remains at the frequency level F1 during the time period between the times t12 and t4.

It should be noted that the parameter level PRL1 is at least approximately twenty-five percent below the parameter level PRL2. For example, the parameter level PRL1 is approximately 25% of the parameter level PRL2 or lower than 25% of the parameter level PRL2. To further illustrate, the parameter level PRL1 is between 0 and approximately 25% of the parameter level PRL2. As another illustration, when the parameter level PRL2 is 1000 watts, the parameter level PRL1 is less than approximately 250 watts or between 0 watts and approximately 250 watts. As yet another illustration, the parameter level PRL1 is within the statistical range from 25% of the parameter level PRL2. As another illustration, the parameter level PRL1 is between 0 and approximately 10% of the parameter level PRL2.

Similarly, it should be noted that the frequency level F1 is at least approximately twenty-five percent below the frequency level F2. For example, the frequency level F1 is approximately 25% of the frequency level F2 or lower than 25% of the frequency level F2. To further illustrate, the frequency level F1 is between 0 and approximately 25% of the frequency level F2. As another illustration, when the frequency level F2 is 1 MHz, the frequency level F1 is less than approximately 0.25 MHz or between 0 MHz and approximately 0.25 MHz. As yet another illustration, the frequency level F1 is within the statistical range from 25% of the frequency level F2. As another illustration, the frequency level F1 is between 0 and approximately 10% of the frequency level F2.

It should further be noted that in some embodiments, a transition of an RF signal, described herein, from one level to another level at approximately the same time a digital pulse signal, described herein, transitions from one state to another state occurs when the RF signal transitions within the statistical range from the transition of the digital pulse signal. For example, the parameter of the RF signal 102 transitions from the parameter level PRL2 to the parameter level PRL1 within the statistical range from the time t11 at which the digital pulse signal DPS1 transitions from the state S1 to the state S0. To illustrate, the parameter of the RF signal 102 transitions from the parameter level PRL2 to the parameter level PRL1 during a time period that is within 0 to 5% from the time t11.

It should also be noted that a first parameter level is approximately at a percentage of a second parameter level when the first parameter level is within the statistical range from the percentage. For example, the parameter level PRL1 is approximately 25% of the parameter level PRL2 when the parameter level PRL1 is between 24% and 30% of the parameter level PRL2. As another example, the parameter level PRL1 is approximately 25% of the parameter level PRL2 when the parameter level PRL1 is between 23% and 28% of the parameter level PRL2.

Similarly, it should also be noted that a first frequency level is approximately at a percentage of a second frequency level when the first frequency level is within the statistical range from the percentage. For example, the frequency level F1 is approximately 25% of the frequency level F2 when the frequency level F1 is between 24% and 30% of the frequency level F2. As another example, the frequency level F1 is approximately 25% of the frequency level F2 when the frequency level F1 is between 25% and 28% of the frequency level F2.

Figure 3A:
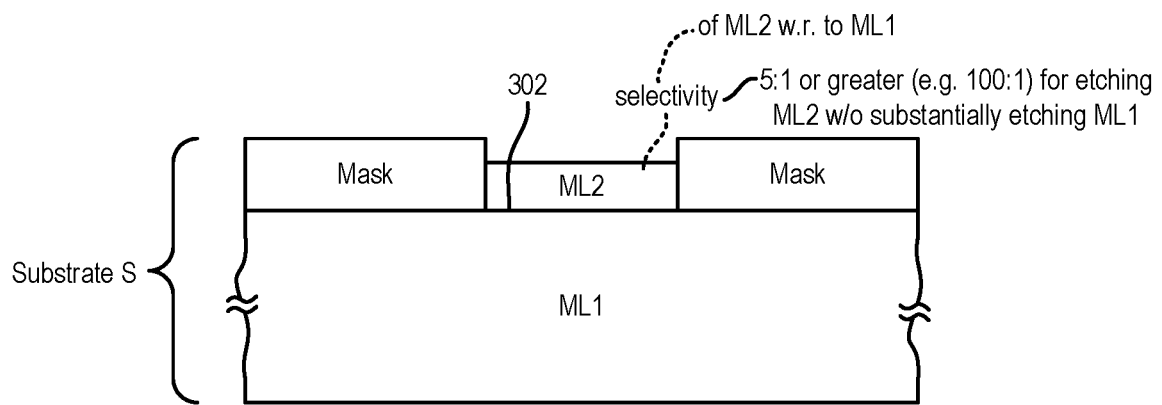
FIG. 3A is an embodiment of a substrate to illustrate selectivity in etching a first material layer of the substrate compared to etching a second material layer of the substrate.

FIG. 3A is an embodiment of the substrate S to illustrate selectivity in etching a material layer ML2 of the substrate S compared to etching another material layer ML1 of the substrate S. The substrate S has the material layer ML2 that is overlaid on top of the material layer ML1. The material layer ML1 is different from the material layer ML2. For example, at least one chemical element of the material layer ML1 is not the same as at least one chemical element of the material layer ML2. To illustrate, a chemical property of the material layer ML2 is different from a chemical property of the material layer ML1. As another illustration, a chemical composition of the material layer ML1 is different from a chemical composition of the material layer ML2. An example of the material layer ML1 is a metal layer, such as a copper layer or an aluminum layer, and an example of the material layer ML2 is silicon dioxide. An example of the material layer ML2 is a silicon nitride layer and an example of the material layer ML1 is a silicon dioxide layer. Another example of the material layer ML2 is an oxide layer and an example of the material layer ML1 is the metal layer. Yet another example of the material layer ML2 is a polysilicon layer and the material layer ML1 is a silicon dioxide layer. Moreover, a portion of the material layer ML1 is overlaid with a mask layer to protect the portion from being etched.

When the RF signal 102 of FIG. 1 having the parameter 214 of FIG. 2, or the frequency 216 of FIG. 2, or a combination thereof, is supplied, selectivity of the material layer ML2 is such that the material layer ML2 is etched at a rate that is self-limiting without substantially etching the material layer ML1. For example, the selectivity of the material layer ML2 is greater than or equal to approximately 5:1. To illustrate, an etch rate of etching the material layer ML2 compared to an etch rate of etching the material layer ML1 is greater than or equal to 5:1. As another illustration, the selectivity of the material layer ML2 is 100:1. As yet another example, when a top surface 302 of the material layer ML1 is reached after etching the material layer ML2, the material layer ML1 is not substantially etched. The top surface 302 is adjacent to a bottom surface of the material layer ML2.

Figure 3B:
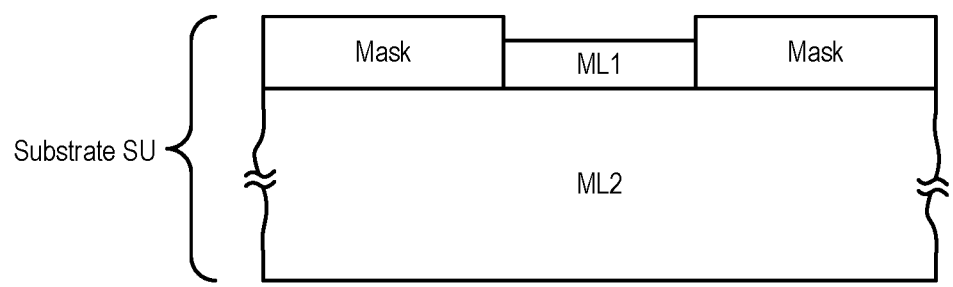
FIG. 3B is a diagram of an embodiment of another substrate in which the second material layer that is overlaid on top of the first material layer is etched without substantially etching the first material layer.

FIG. 3B is a diagram of an embodiment of a substrate SU. In the substrate SU, the material layer ML1 is overlaid on top of the material layer ML2 instead of the material layer ML2 being overlaid on top of the material layer ML1. Portions of the material layer ML2 are protected by the mask layer.

FIG. 4 is a diagram of an embodiment of a system 400 to illustrate identification of the parameter levels PRL1 and PRL2 and the frequency levels F1 and F2 for which monoenergetic ions of the plasma within the plasma chamber are generated for etching the material layer ML2 of FIG. 3A at a rate that is self-limiting without substantially etching the material layer ML1 of FIG. 3A. The system 400 is used to execute a training routine or a lab routine in which the substrate S is processed instead of the substrate SU. The system 400 has the same structure as that of the system 100 of FIG. 1 except that the system 400 includes a probe 402, a wafer bias sensor, and a current sensor. Examples of the probe 402 include a planar ion flux probe and a Langmuir probe. An example of the wafer bias sensor includes an in-situ direct current (DC) probe pick-up pin and related hardware that is used to measure wafer bias. The hardware is coupled to the DC probe pick-up pin. As an example, the wafer bias sensor measures wafer bias on a top surface of the chuck. The top surface of the chuck faces the upper electrode and a gap is formed between the top surface of the chuck and the upper electrode.

The probe 402 is located within the gap and the in-situ DC probe pick-up pin is located at the top surface of the chuck. Moreover, the wafer bias sensor is coupled to the processor of the host computer and the current sensor is also coupled to the processor of the host computer. The memory device of the host computer stores a correspondence, such as a one-to-one link or a one-to-one relationship, between an identifier of the material layer ML2 of the substrate S to be etched at a rate that is self-limiting without substantially etching the material layer ML1 of the substrate S, an amount IF4 of ion flux of ions of plasma within the plasma chamber, and a range from IE41 to IE42 of ion energy of the ions. The identifier of the material layer ML2 is an example of information associated with the material layer ML2. Examples of an identifier of a material layer include an alphanumeric code, or a combination of numbers, or a combination of numbers and letters that distinguishes the material layer from another material layer. The range from IE41 to IE42 is a range at full width at half maximum (FWHM) of a relationship between the ion flux and the ion energy when the substrate S is being etched, and the amount IF4 is the amount at the FWHM.

The processor of the host computer provides other multiple parameter levels, such as a parameter level PRL5S1 for a state S1 of another digital pulse signal DPS5 and a parameter level PRL5S0 for a state S0 of the other digital pulse signal DPS5, which is different from the digital pulse signal DPS1 of FIG. 2. For example, the other digital pulse signal DPS5 has a different duty cycle DC5 than the duty cycle DC1 of the digital pulse signal DPS1. Moreover, the other parameter levels PRL5S1 and PRL5S0 are different from the parameter levels PRL1 and PRL2 of FIG. 2. For example, a difference between a first one of the other parameter levels PRL5S1 for the state S1 of the other digital pulse signal DPS5 and a second one of the other parameter levels PRL5S0 for the state S0 of the other digital pulse signal DPS5 is greater than or less than a difference between the parameter levels PRL1 and PRL2.

Also, the processor of the host computer provides other multiple frequency levels, such as a frequency level f5S1 for the state S1 of the other digital pulse signal DPS5 and a frequency level f5S0 for the state S0 of the other digital pulse signal DPS5. For example, the other frequency levels f5S1 and f5S0 are different from the frequency levels F1 and F2. To illustrate, a difference between a first one of the other frequency levels f5S1 for the state S1 of the other digital pulse signal DPS5 and a second one of the other frequency levels f250 for the state S0 of the other digital pulse signal DPS5 is greater than or less than a difference between the frequency levels F1 and F2.

In a similar manner to that described above for generating the RF signal 102 having the parameter levels PRL1 and PRL2 and the frequency levels F1 and F2, another RF signal 504, which is shown below in FIG. 5, having the other parameter levels PRL5S1 and PRL5S0 and the other frequency levels f5S1 and f5S0 is generated by the RF generator upon receiving the other digital pulse signal DPS5, the other frequency levels f5S1 and f5S0, and the other parameter levels PRL5S1 and PRL5S0 from the processor of the host computer system. The impedance matching circuit matches the impedance of the load with that of the source to generate another modified RF signal 506 (FIG. 5) from the other RF signal 504 and sends the other modified RF signal to the lower electrode of the plasma chamber. When the one or more process gases are supplied to the gap between the upper electrode and the chuck of the plasma chamber in addition to supplying the other modified signal 506 to the lower electrode, plasma is stricken or generated within the plasma chamber.

When plasma is stricken or generated within the plasma chamber based on the other modified signal 506, the wafer bias sensor measures wafer bias at the top surface of the chuck. The wafer bias that is measured is provided by the wafer bias sensor to the processor of the host computer. The processor calculates a range of ion energy of ions of plasma within the plasma chamber from the wafer bias. For example, the processor calculates the range of ion energy as:

$$Ei=(Vdc+V\text{peak}) \tag{1}$$

where Ei is the range of ion energy, Vdc is the wafer bias measured at the top surface of the chuck, and Vpeak is a zero-to-peak voltage at the top surface of the chuck. It should be noted that as an example, Vdc has a negative value and Vpeak has a positive or a negative value. An example of Ei is a range from IE51 to IE52, which is described below with reference to FIG. 5. As an example, the zero-to-peak voltage Vpeak is measured by a voltage sensor (not shown), e.g., voltage probe, etc., that is coupled to the chuck. It should be noted that the wafer bias Vdc has a range of values and/or the zero-to-peak voltage Vpeak has a range of values for which the range Ei is calculated. The range from IE51 to IE52 of ion energy is stored in the memory device of the host computer.

Moreover, the probe 402 has a surface area, e.g., measured in square centimeters, etc., and is rotated within the plasma chamber. The probe 402 rotates to collect ion current of ions of plasma within the plasma chamber over the surface area of the probe 402 to generate electrical signals and sends the electrical signals to the current sensor. The current sensor measures an amount of current from the electrical signals and provides the amount of current to the processor of the host computer. The processor of the host computer calculates the amount of current per unit surface area of the probe 402 to calculate an ion flux IF5, which is described below with reference to FIG. 5. Each ion of plasma has generates a predetermined amount of current.

The processor stores the ion flux IF5 that is calculated within the memory device of the host computer.

The processor determines whether the ion flux IF5 that is calculated is within a preset range from the ion flux IF4 and further determines whether the range from IE51 to 1E52 is within a predetermined window from the range IE41 through IE42. For example, the processor determines whether the ion flux IF5 that is calculated is within a preset percentage, such as 0% to 10%, from the value IF4 of ion flux and determines whether a lowest value in the range IE51 to 1E52 is within the preset percentage from the lowest value IE41 of ion energy and a highest value in the range IE51 to 1E52 is within the preset percentage from the highest value IE42 of ion energy. To illustrate, the processor determines whether the ion flux IF5 that is calculated is the same as the ion flux IF4 and determines whether the range IE51 to IE52 is the same as the range IE41 to IE42. The preset range of ion flux and the predetermined window of ion energy are stored within the memory device of the host computer.

Upon determining that the ion flux IF5 that is calculated is not within the preset range from the ion flux IF4 or the range IE51 to IE52 of ion energy is not within the predetermined window from the range IE41 to IE41, or the duty cycle DC5 of the other digital pulse signal DPS5 is not within a pre-calculated range from the duty cycle DC1, the processor of the host computer changes the other parameter levels PRL5S1 and PRL5S0 to different parameter levels, such as the parameter levels PRL2 and PRL1, or changes the other frequency levels f5S1 and f5S0 to different frequency levels, such as the frequency levels F2 and F1, or changes the duty cycle DC5 of the other digital pulse signal DPS5 to a different duty cycle, such as the duty cycle DC1 of the digital pulse signal DPS1, or changes two or more of the other parameter levels, the other frequency levels, and the duty cycle of the other digital pulse signal DPS5. The processor provides the different parameter levels, the different frequency levels to the RF generator, and/or the different duty cycle to the RF generator. The RF generator generate a different RF signal, such as the RF signal 102, having the different parameter levels and/or the different frequency levels based on the different duty cycle, and sends the different RF signal to the impedance matching circuit. The impedance matching circuit generates a different modified RF signal, such as the modified RF signal 104, from the different RF signal and sends the different modified RF signal to the lower electrode.

When the different modified RF signal is supplied to the lower electrode and the one or more process gases are supplied to the plasma chamber, the wafer bias sensor measures a different wafer bias and the current sensor measures a different amount of current from different electrical signals received from the probe 402. The processor of the host computer system in a similar manner to that described above using the equation (1) calculates a different range of ion energy. Moreover, the processor in a similar manner to that described above calculates a different amount of ion flux from the different amount of current. The processor further determines that the different range of ion energy is within the predetermined window from the range IE41 through IE42. For example, the processor determines that the different range of ion energy is the same as the range IE41 through IE42. Moreover, the processor determines that the different amount of ion flux is within the preset range from the ion flux IF4. For example, the processor determines that the different amount of ion flux is the same as the ion flux IF4.

Upon determining that the different range of ion energy is within the predetermined window from the range IE41 through IE42 of ion energy and the different amount of ion flux is within the preset range from the ion flux IF4, the processor stores the different parameter levels, such as the parameter levels PRL1 and PRL2, the different frequency levels, such as the frequency levels F1 and F2, and the different duty cycle, such as the duty cycle DC1, within the memory device of the host computer. The processor associates, such as establishes a one-to-one correspondence or a mapping or a link, among the ion flux IF4, the range IE41 through IE42 of ion energy, the parameter level PRL1, the parameter level PRL2, the frequency level F1, the frequency level F2, and the duty cycle DC1, and stores the one-to-one correspondence within the memory device of the host computer.

It should be noted that by supplying the RF signal 102 having the parameter level PRL1 and the parameter level PRL2 or having the frequency levels F1 and F2, and generated based on the duty cycle DC1, the material layer ML2 is etched at a rate that is self-limiting without substantially etching the material layer ML1. For example, in response to receiving the modified RF signal 104, the plasma chamber etches the material layer ML2 at a rate that is self-limiting without substantially etching the material layer ML1. The modified RF signal 104 is output from the impedance matching circuit upon receiving the RF signal 102. To illustrate, upon receiving the modified RF signal 104 from the impedance matching circuit and the one or more process gases, the plasma chamber etches the material layer ML2 at the rate that is self-limiting without substantially etching the material layer ML1. FIGS. 1 and 2, illustrated above, provide an application of the RF signal 102 having the parameter levels PRL1 and PRL2 and/or the frequency levels F1 and F2 during processing of the substrate S to etch the material layer ML2 at a rate that is self-limiting without substantially etching the material layer ML1. For example, the processor of the host computer receives an indication from the input device that the material layer ML2 is to be etched within the substrate S. The processor accesses the ion energy range from IE41 to IE42 and the ion flux IF4 to identify the ion energy range and the ion flux corresponding to, such as have a link to, a mapping with, or a one-to-one relationship with, etching the material layer ML2 at a rate that is self-limiting without substantially etching the material layer ML1. The processor accesses the parameter levels PRL1 and PRL2 and/or the frequency levels F1 and F2 that correspond to the ion energy range from IE41 to IE42 and to the ion flux IF4, and controls the RF generator in the manner described above to generate the RF signal 102. When the RF signal 102 is supplied by the RF generator, the substrate S is etched to etch the material layer ML2 at a rate that is self-limiting without substantially etching the material layer ML1.

Figure 5:
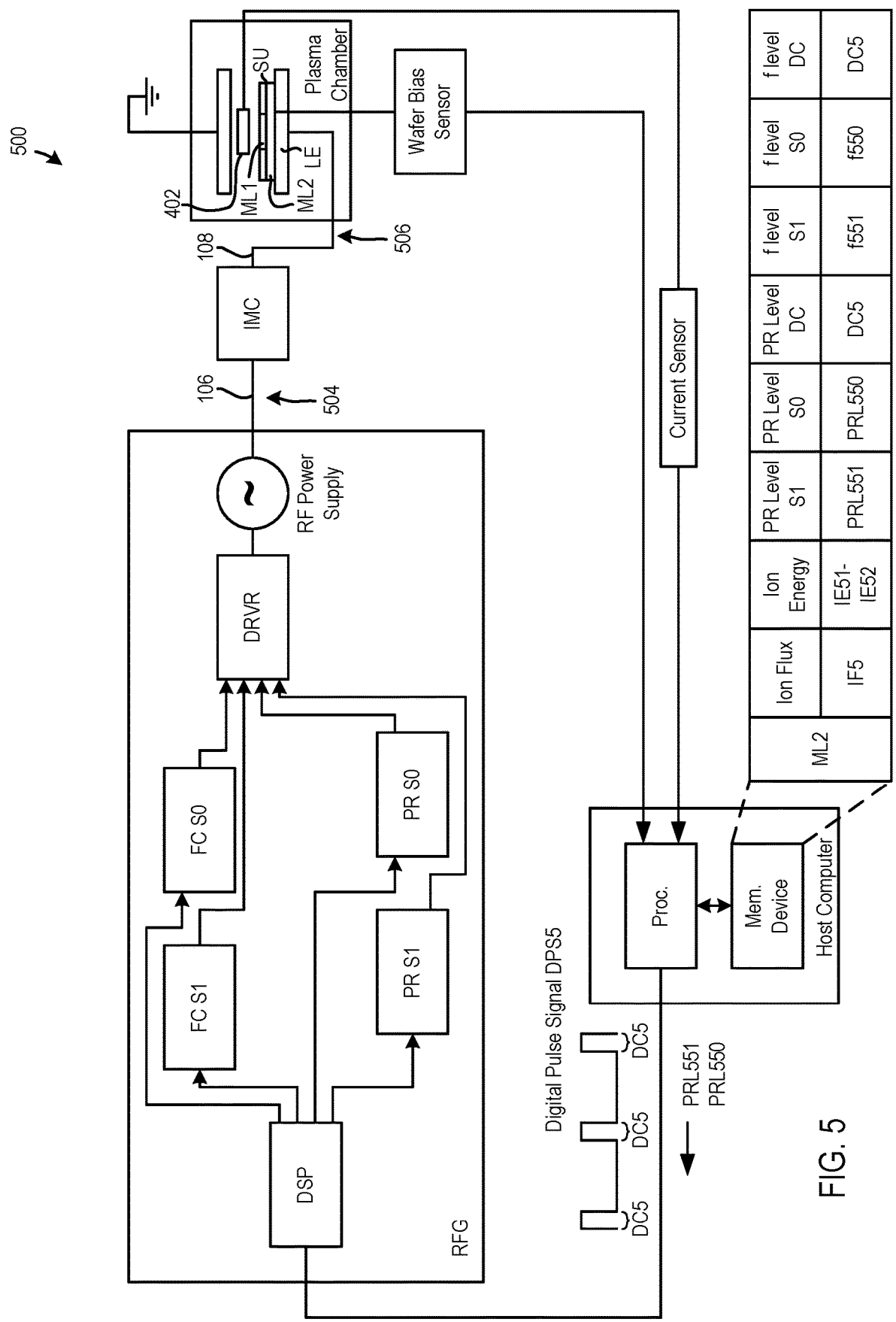
FIG. 5 is a diagram of an embodiment of a system to illustrate identification of multiple parameter levels and multiple frequency levels for which monoenergetic ions of plasma within a plasma chamber are generated for etching the second material layer without substantially etching the first material layer.

FIG. 5 is a diagram of an embodiment of a system 500 to illustrate that etching of the material layer ML1 is performed at a rate that is self-limiting without substantially etching the material layer ML2 by supplying the RF signal 504 having the parameter levels PRL5S1 and PRL5S0, and/or the frequency levels f5S1 and f5S0, and the duty cycle DC5. The system 500 is used to execute a training routine or a lab routine in which the substrate SU is processed instead of the substrate S. The system 500 is the same in structure as the system 400 of FIG. 4 except that in the system 500, the substrate SU, which is different from the substrate S, is being processed within the plasma chamber.

The memory device of the host computer stores a correspondence, such as a one-to-one link or a one-to-one relationship, between an identifier of the material layer ML1 of the substrate SU to be etched at a rate that is self-limiting without substantially etching the material layer ML2 of the substrate SU, the amount IF5 of ion flux of ions of plasma within the plasma chamber, and the range from IE51 to IE52 of ion energy of the ions. The identifier of the material layer ML1 is an example of information associated with the material layer ML1. The range from IE51 to IE52 is a range at FWHM of a relationship between the ion flux and the ion energy when the substrate SU is etched, and the amount IF5 is the amount at the FWHM.

During the training routine of FIG. 5, the processor of the host computer provides multiple parameter levels, such as the parameter level PRL2 for a state S1 of the digital pulse signal DPS1 and the parameter level PRL1 for a state S0 of the digital pulse signal DPS1. Also, the processor of the host computer provides multiple frequency levels, such as the frequency level F2 for the state S1 of the digital pulse signal DPS1 and the frequency level F1 for the state S0 of the digital pulse signal DPS1.

In a similar manner to that described above for generating the RF signal 504 having the parameter levels PRL5S1 and PRL5S0 and the frequency levels f5S1 and f5S0, during the training routine of FIG. 5, the RF signal 102, which is shown above in FIG. 4, having the parameter levels PRL2 and PRL1 and the frequency levels F2 and F1 is generated by the RF generator upon receiving the digital pulse signal DPS1, the frequency levels F2 and F1, and the parameter levels PRL2 and PRL1 from the processor of the host computer system. During the training routine of FIG. 5, the impedance matching circuit matches the impedance of the load with that of the source to generate the modified RF signal 104 (FIG. 4) from the RF signal 102 and sends the modified RF signal 104 to the lower electrode of the plasma chamber. Also, during the training routine of FIG. 5, when the one or more process gases are supplied to the gap between the upper electrode and the chuck of the plasma chamber in addition to supplying the modified signal 104 to the lower electrode, plasma is stricken or generated within the plasma chamber.

When plasma is stricken or generated within the plasma chamber based on the modified signal 104 during the training routine of FIG. 5, the wafer bias sensor measures wafer bias at the surface of the chuck. The wafer bias that is measured during the training routine of FIG. 5 is provided by the wafer bias sensor to the processor of the host computer. The processor calculates a range of ion energy of ions of plasma within the plasma chamber from the wafer bias. For example, during the training routine of FIG. 5, the processor calculates the range of by applying the equation (1). An example of Ei calculated during the training routine of FIG. 5 is the range from IE41 to IE42, which is described above with reference to FIG. 4. Moreover, in this example, the zero-to-peak voltage Vpeak is measured by the voltage sensor (not shown) that is coupled to the chuck. The range from IE41 to IE42 of ion energy determined during the training routine of FIG. 5 is stored in the memory device of the host computer.

Moreover, during the training routine executed by using the system 500 in which the substrate SU is processed, in a manner similar to that described above for calculating the ion flux IF5, the processor of the host computer calculates the amount of current per unit surface area of the probe 402 to calculate the ion flux IF4. The processor stores the ion flux IF4 that is calculated within the memory device of the host computer.

The processor determines whether the ion flux IF4 that is calculated is within the preset range from the ion flux IF5 stored within the memory device and further determines whether the range from IE41 to IE42 calculated during the training routine of FIG. 5 is within the predetermined window from the range IE51 through 1E52 stored within the memory device. For example, the processor determines whether the ion flux IF4 that is calculated during the training routine of FIG. 5 is within the preset percentage, such as 0% to 10%, from the value IF5 of ion flux and determines whether a lowest value in the range IE41 to IE42 is within the preset percentage from the lowest value of ion energy in the range from IE51 to IE52 and a highest value in the range IE41 to IE42 is within the preset percentage from the highest value in the range IE51 to IE52 of ion energy. To illustrate, the processor determines whether the ion flux IF4 that is calculated is the same as the ion flux IF5 and determines whether the range IE41 to IE42 is the same as the range IE51 to IE52.

Upon determining that the ion flux IF4 that is calculated during the training routine of FIG. 5 is not within the preset range from the ion flux IF5 stored within the memory device or the range IE41 to IE42 of ion energy that is calculated during the training routine of FIG. 5 is not within the predetermined window from the range IE51 to 1E52 stored within the memory device, or the duty cycle DC1 of the digital pulse signal DPS1 is not within the pre-calculated range from the duty cycle DC5, the processor of the host computer changes the parameter levels PRL2 and PRL1 to changed parameter levels, such as the parameter levels PRL5S1 and PRL5S0, or changes the frequency levels F1 and F2 to changed frequency levels, such as the frequency levels f5S1 and f5S0, or changes the duty cycle DC1 of the digital pulse signal DPS1 to a changed duty cycle, such as the duty cycle DC5, or changes two or more of the parameter levels PRL2 and PRL1, the frequency levels F1 and F2, and the duty cycle DC1 of the digital pulse signal DPS1. The processor provides the changed parameter levels, the changed frequency levels to the RF generator, and/or the changed duty cycle to the RF generator. The RF generator generate a changed RF signal, such as the RF signal 504, having the changed parameter levels based on the changed duty cycle and/or the changed frequency levels based on the changed duty cycle, and sends the changed RF signal to the impedance matching circuit. The impedance matching circuit generates a changed modified RF signal, such as the modified RF signal 506, from the changed RF signal and sends the changed modified RF signal to the lower electrode.

When the changed modified RF signal is supplied to the lower electrode and the one or more process gases are supplied to the plasma chamber, the wafer bias sensor measures a changed wafer bias and the current sensor measures a changed amount of current from changed electrical signals received from the probe 402. The processor of the computer system in a similar manner to that described above using the equation (1) calculates a changed range of ion energy. Moreover, the processor in a similar manner to that described above calculates a changed amount of ion flux from the changed amount of current. The processor further determines that the changed range of ion energy is within the predetermined window from the range 1E51 through IE52 stored within the memory device. For example, the processor determines that the changed range of ion energy is the same as the range IE51 through 1E54 stored within the memory device. Moreover, the processor determines that the changed amount of ion flux is within the preset range from the ion flux IF5 stored within the memory device. For example, the processor determines that the changed amount of ion flux is the same as the ion flux IF5 stored within the memory device.

Upon determining that the changed range of ion energy is within the predetermined window from the range IE51 through IE52 of ion energy and the changed amount of ion flux is within the preset range from the ion flux IF5, the processor stores the changed parameter levels, such as the parameter levels PRL5S1 and PRL5S0, the changed frequency levels, such as the frequency levels f5S1 and f5S0, and the changed duty cycle, such as the duty cycle DC5, within the memory device of the host computer. The processor associates, such as establishes a one-to-one correspondence or a mapping or a link, among the ion flux IF5, the range IE51 through IE52 of ion energy, the parameter level PRL5S1, the parameter level PRL5S0, the frequency level f5S1, the frequency level f5S0, and the duty cycle DC5. It should be noted that by supplying the RF signal 504 having the parameter level PRL5S1 and the parameter level PRL5S0 or having the frequency levels f5S1 and f5S0, and generated based on the duty cycle DC5, the material layer ML2 is etched at a rate that is self-limiting without substantially etching the material layer ML1.

In various embodiments, instead of the multiple frequency controllers FCS1 and FCS0, one frequency controller is used to control the RF power supply to generate a single frequency level of an RF signal instead of the multiple frequency levels f5S1 and f5S0. The single frequency level includes one or more values of frequency of the RF signal. The single frequency level represents is a continuous wave of frequency. The processor of the host computer sends a value of the single frequency level of the RF signal to the digital signal processor of the RF generator. Upon receiving the value of the single frequency level, regardless of whether the state of the digital pulse signal DPS5 is S1 or S0, the digital signal processor sends the value to the frequency controller for storage in a memory device of the frequency controller. Moreover, upon receiving the value of the single frequency level, regardless of whether the state of the digital pulse signal DPS5 is S1 or S0, the frequency controller sends the value to the driver system. The driver system generates a current signal based on the value of the single frequency level and provides the current to the RF power supply. Upon receiving the current signal, the RF power supply generates the RF signal having the single frequency level and the multiple parameter levels PRL5S0 and PRL5S1.

It should be noted that by supplying the RF signal 504 having the parameter level PRL5S1 and the parameter level PRL5S0 or having the frequency levels f5S1 and f5S0, and generated based on the duty cycle DC5, the material layer ML1 is etched at a rate that is self-limiting without substantially etching the material layer ML2. For example, the processor of the host computer receives an indication from the input device that the material layer ML1 is to be etched within the substrate SU. The processor accesses the ion energy range from IE51 to 1E52 and the ion flux IF5 to identify that the ion energy range and the ion flux correspond to, such as have a link to, a mapping with, or a one-to-one relationship with, etching the material layer ML1 at a rate that is self-limiting without substantially etching the material layer ML2. The processor accesses the parameter levels PRL5S1 and PRL5S0 and/or the frequency levels f5S1 and f5S0 that correspond to the ion energy range from IE51 to 1E52 and to the ion flux IF5, and controls the RF generator in the manner described above to generate the RF signal 504. When the RF signal 504 is supplied by the RF generator, the substrate SU is etched to etch the material layer ML1 at a rate that is self-limiting without substantially etching the material layer ML2. For example, in response to receiving the modified RF signal 506 from the impedance matching circuit, the plasma chamber etches the material layer ML1 at a rate that is self-limiting without substantially etching the material layer ML2. The modified RF signal 506 is output from the impedance matching circuit upon receiving the RF signal 504. To illustrate, upon receiving the modified RF signal 506 from the impedance matching circuit and the one or more process gases, the plasma chamber etches the material layer ML1 at the rate that is self-limiting without substantially etching the material layer ML2.

In some embodiments, one or more of the operations, described herein, as being performed by the digital signal processor of the RF generator are performed by the processor of the host computer.

In several embodiments, one or more of the operations, described herein, as being performed by the digital signal processor of the RF generator, and/or one or more of the operations, described herein, as being performed by the frequency controller FCS1, and/or one or more of the operations, described herein, as being performed by the frequency controller FCS0, and/or one or more of the operations, described herein, as being performed by the parameter controller PRS1, and/or one or more of the operations, described herein, as being performed by the parameter controller PRS0, are performed by the processor of the host computer.

In various embodiments, one or more of the operations, described herein, as being performed by the processor of the host computer are performed by the digital signal processor of the RF generator.

In some embodiments, the parameter controllers PRS1 and PRS0 of the RF generator and/or the frequency controllers FCS1 and FCS0 of the RF generator are computer program modules of a computer program that is executed by the digital signal processor of the RF generator.

Figure 6:
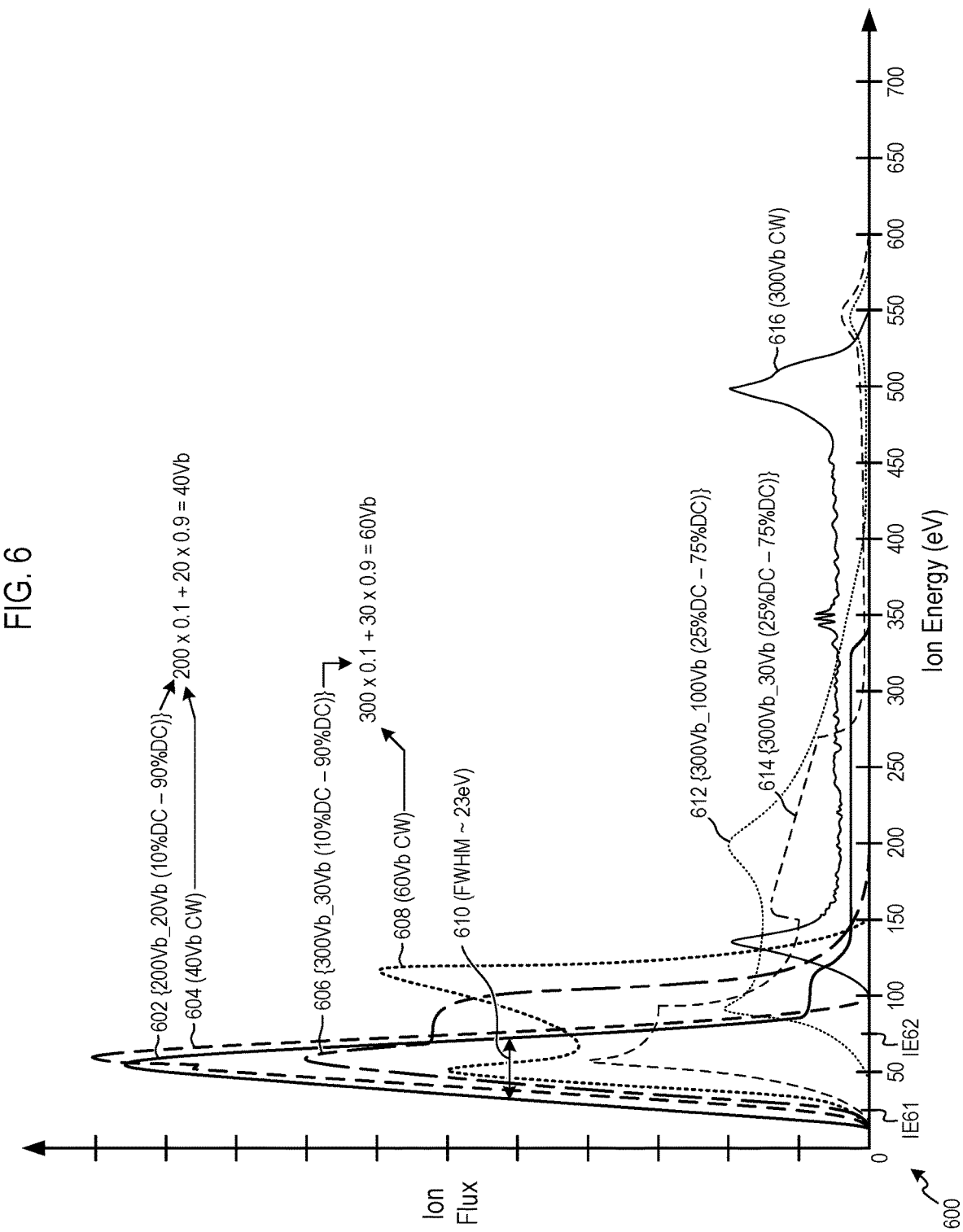
FIG. 6 is an embodiment of a graph to illustrate a relationship between ion flux and ion energy.

FIG. 6 is an embodiment of a graph 600 to illustrate a relationship between ion flux and ion energy. The ion energy is measured in electron volts (eV). The graph 600 illustrates multiple plots 602, 604, 606, 608, 612, 614, and 616. The plot 602 is generated when 200 V of bias voltage is applied to the lower electrode during the state S1 of the digital pulse signal DCS1 of FIG. 2 and 20 V of bias voltage is applied to the lower electrode of FIG. 1 during the state S0 of the digital pulse signal DCS1. Moreover, the plot 602 is generated when a duty cycle of the state S1 of the digital pulse signal DCS1 is 10%. For example, each occurrence of the state S1 of the digital pulse signal DCS1 is for 10% of a corresponding clock cycle of the clock signal 210 of FIG. 2 and each occurrence of the state S0 of the digital pulse signal DCS1 is for the remaining 90% of the corresponding clock cycle. To illustrate, the plot 602 is generated based on the RF signal 102 of FIG. 1. An average bias voltage for the plot 602 is 40 V.

An FWHM 610 of the plot 602 is approximately 23 eV with a minor population of ions of plasma within the plasma chamber having an ion energy distribution greater than approximately 23 eV. It should be noted that 23 eV represents an example of a distribution of energy of monoenergetic ions of plasma within the plasma chamber. At the FWHM 610, the plot 602 has ion energies from an ion energy value of IE61 to an ion energy value of IE62 and has an ion flux value.

The plot 604 is generated when a continuous wave bias voltage of 40 V is applied to the lower electrode. The continuous wave bias voltage is applied when an RF signal generated by an RF generator does not transition between multiple parameter levels, such as the parameter levels PRL1 and PRL2, and does not transition between multiple frequency levels, such as the frequency levels F1 and F2. For example, a standard deviation between any two values of a single parameter level of the RF signal that does not transition between the multiple parameter levels ranges from 0 to 20%. To illustrate, the standard deviation between any two values of the single parameter level of the RF signal that does not transition between the multiple parameter levels ranges from 0 to 10%.

The plot 606 is generated when 300 V of bias voltage is applied to the lower electrode during the state S1 of the digital pulse signal DCS1 and 30 V of bias voltage is applied to the lower electrode during the state S0 of the digital pulse signal DCS1. Moreover, the plot 606 is generated when the duty cycle of the state S1 of the digital pulse signal DCS1 is 10%. To illustrate, the plot 606 is generated based on the RF signal 102. Also, the plot 608 is generated when a continuous wave bias voltage of 60 V is applied to the lower electrode. A time averaged bias voltage for the plot 606 is approximately 60 V.

The plot 612 is generated when 300 V of bias voltage is applied to the lower electrode during the state S1 of the digital pulse signal DCS1 and 100 V of bias voltage is applied to the lower electrode of FIG. 1 during the state S0 of the digital pulse signal DCS1. Moreover, the plot 612 is generated when a duty cycle of the state S1 of the digital pulse signal DCS1 is 25%. For example, each occurrence of the state S1 of the digital pulse signal DCS1 is for 25% of a corresponding clock cycle of the clock signal 210 of FIG. 2 and each occurrence of the state S0 of the digital pulse signal DCS1 is for the remaining 75% of the corresponding clock cycle. To illustrate, the plot 612 is generated based on the RF signal 102 of FIG. 1.

Moreover, the plot 614 is generated when 300 V of bias voltage is applied to the lower electrode during the state S1 of the digital pulse signal DCS1 and 30 V of bias voltage is applied to the lower electrode during the state S0 of the digital pulse signal DCS1. Moreover, the plot 614 is generated when the duty cycle of the state S1 of the digital pulse signal DCS1 is 25%. The plot 616 is generated when a continuous wave bias voltage of 300 V is applied to the lower electrode.

It should be noted that in some embodiments, a multistate bias voltage, described herein, provides various examples of the RF signal 102. For example, the bias voltage that transitions between 200 V and 20 V with the 10% duty cycle of the digital pulse signal DCS1 is the same as a voltage of the RF signal 102. As another example, the bias voltage that transitions between 300 V and 30 V with the 10% duty cycle of the digital pulse signal DCS1 is the same as a voltage of the RF signal 102. As yet another example, the bias voltage that transitions between 300 V and 100 V with the 25% duty cycle of the digital pulse signal DCS1 is the same as a voltage of the RF signal 102. As another example, the bias voltage that transitions between 300 V and 30 V with the 25% duty cycle of the digital pulse signal DCS1 is the same as a voltage of the RF signal 102.

It should further be noted that the plot 602 has a narrower distribution of ion energy compared to the plot 604 for the continuous wave bias voltage of 40 V. For example, at the FWHM 610, the plot 602 is narrower compared to an FWHM of the plot 604. The narrower distribution of ion energy facilitates generation of monoenergetic ions of plasma within the plasma chamber to etch a first material layer, such as the material layer ML2 of FIG. 3A, without substantially etching a second material layer, such as the material layer ML1 of FIG. 3A, that is below the first material layer. It is also noted that for the same amount of average bias voltage for the plots 602 and 604, such as the average bias voltage of 40 V for the plot 602 and the average bias voltage of 40 V for the plot 604, the narrower distribution of ion energy is achieved when the RF signal 102, which is a multistate RF signal, is applied compared to when a continuous wave RF signal is applied. The continuous wave bias voltages of 40V, 60V, and 300V provide various examples of voltages of the continuous wave RF signal.

It should further be noted that the plot 602 is generated when a first voltage of the RF signal 102 is optimized compared to a second voltage of the RF signal 102. The second voltage of the RF signal 102 is supplied to generate the plot 606. The second voltage of the RF signal 102 is modified, such as changed or decreased, to the first voltage of the RF signal 102 to optimize the second voltage to achieve the first voltage. For example, the parameter level PRL2 of 200 V used to generate the plot 602 is lower than the parameter level PRL2 of 300 V used to generate the plot 606. Also, the parameter level PRL1 of 20 V used to generate the plot 602 is lower than the parameter level PRL1 of 30 V used to generate the plot 606. As an example, the parameter level PRL1 of 30 V is modified, such as changed or decreased, to the parameter level PRL1 of 20 V to optimize the parameter level PRL1 of 30 V. The plot 602 has a narrower distribution of ion energy compared to the plot 606. For example, the FWHM 610 is narrower compared to an FWHM of the plot 606.

Similarly, it should be noted that the plot 606 is generated when the second voltage of the RF signal 102 is optimized compared to a third voltage of the RF signal 102. The third voltage of the RF signal 102 is modified, such as changed or decreased, to the second voltage of the RF signal 102 to optimize the third voltage to achieve the second voltage. The third voltage of the RF signal 102 is supplied to generate the plot 612. For example, a duty cycle value of 10% used to generate the plot 606 is lower than a duty cycle value of 25% used to generate the plot 612. To illustrate, the duty cycle value of 25% is modified, such as reduced or changed, to the duty cycle value of 10% to optimize the duty cycle of 25%. Each of the duty cycle values of 10% and 25% is an example of the duty cycle DC1. The plot 606 has a narrower distribution of ion energy compared to the plot 612. For example, the FWHM of the plot 606 is narrower compared to an FWHM of the plot 612.

Figure 7:
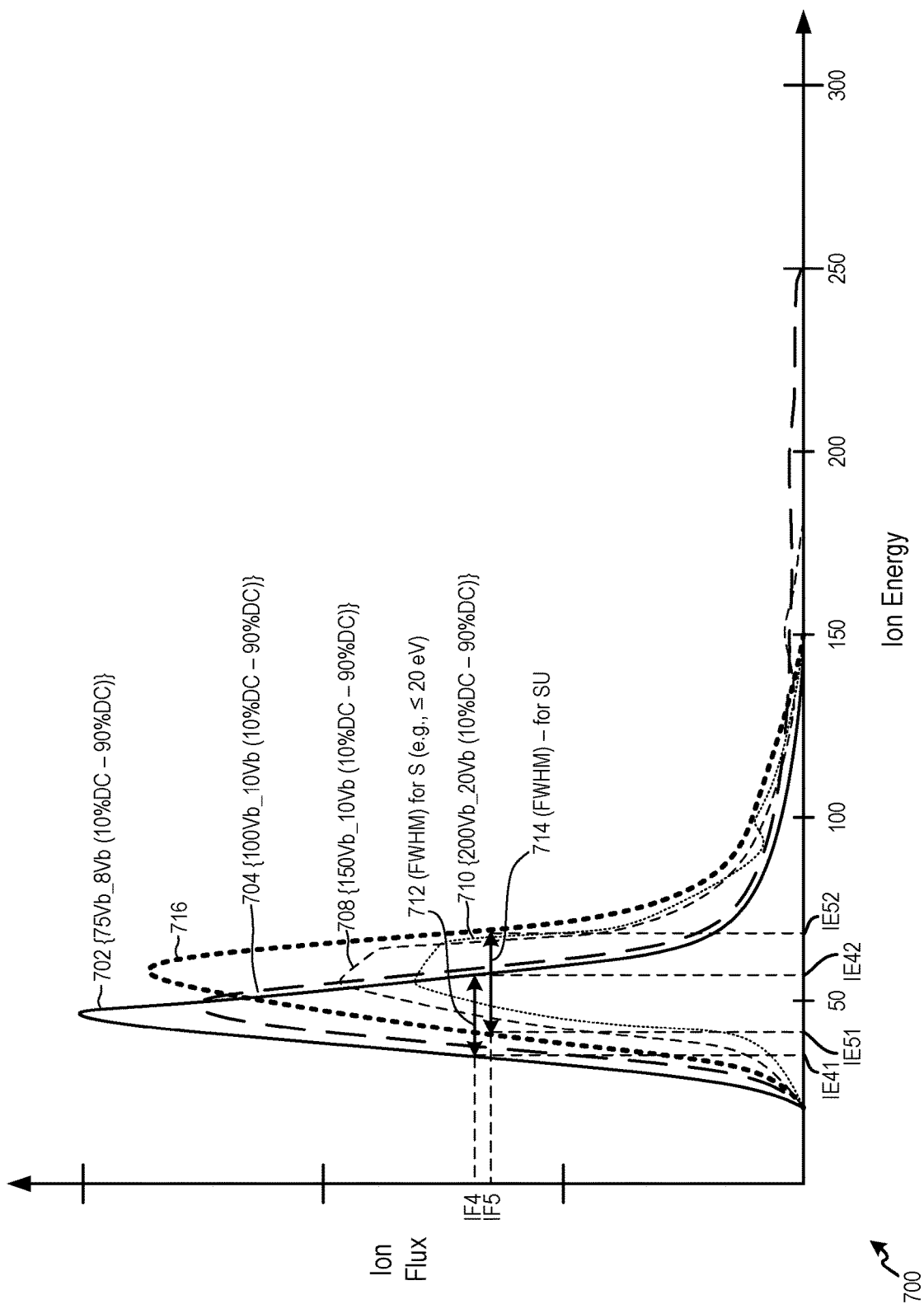
FIG. 7 is an embodiment of a graph to illustrate a relationship between ion flux and ion energy.

FIG. 7 is an embodiment of a graph 700 to illustrate the relationship between ion flux and ion energy. The graph 700 illustrates multiple plots 702, 704, 708, 710, and 716. The plot 702 is generated when 75 V of bias voltage is applied to the lower electrode during the state S1 of the digital pulse signal DCS1 of FIG. 2 and 8 V of bias voltage is applied to the lower electrode of FIG. 1 during the state S0 of the digital pulse signal DCS1. Moreover, the plot 702 is generated when the duty cycle of the state S1 of the digital pulse signal DCS1 is 10%. To illustrate, the plot 702 is generated based on the RF signal 102 of FIG. 1. Moreover, the plot 702 is generated when the RF signal 102 of FIG. 1 is used to etch the material layer ML2 of the substrate S at a rate that is self-limiting without substantially etching the material layer ML1 of the substrate S. At a FWHM 712 of the plot 702, the plot 702 ranges from the ion energy of 1E41 to the ion energy of 1E42 and has the ion flux value of IF4. For example, at the FWHM 712, ions of plasma within the plasma chamber are monoenergetic and have ion energies that have a distribution of approximately 20 eV. It should be noted that the FWHM of ion energy reduces from approximately 23 eV to approximately 20 eV when a parameter level for the state S1 of the digital pulse signal DCS1 for generating the ion energies having the FWHM of approximately 23 eV is reduced and when a parameter level for the state S0 of the digital pulse signal DCS1 for generating the ion energies having the FWHM of approximately 23 eV is also reduced. An energy band from IE41-IE42 is optimized for etching the material layer ML2 at a rate that is self-limiting without substantially etching the material layer ML1 compared to the ion energy band from IE61-IE62 of FIG. 6. Also, a lower number of ions have a greater ion energy distribution than approximately 20 eV than a number of ions having an ion energy distribution greater than 23 eV for the plot 602 of FIG. 6.

The plot 704 is generated when 100 V of bias voltage is applied to the lower electrode during the state S1 of the digital pulse signal DCS1 and 10 V of bias voltage is applied to the lower electrode during the state S0 of the digital pulse signal DCS1. Moreover, the plot 704 is generated when the duty cycle of the state S1 of the digital pulse signal DCS1 is 10%. To illustrate, the plot 704 is generated based on the RF signal 102.

The plot 708 is generated when 150 V of bias voltage is applied to the lower electrode during the state S1 of the digital pulse signal DCS1 and 10 V of bias voltage is applied to the lower electrode of FIG. 1 during the state S0 of the digital pulse signal DCS1. Moreover, the plot 708 is generated when the duty cycle of the state S1 of the digital pulse signal DCS1 is 10%. To illustrate, the plot 708 is generated based on the RF signal 102 of FIG. 1.

Moreover, the plot 710 is generated when 200 V of bias voltage is applied to the lower electrode during the state S1 of the digital pulse signal DCS1 and 20 V of bias voltage is applied to the lower electrode during the state S0 of the digital pulse signal DCS1. Moreover, the plot 710 is generated when the duty cycle of the state S1 of the digital pulse signal DCS1 is 10%.

The plot 716 is generated when the RF signal 504 of FIG. 5 is used to etch the material layer ML1 of the substrate SU at a rate that is self-limiting without substantially etching the material layer ML2 of the substrate SU. The plot 714 has an FWHM 714. At the FWHM 714 of the plot 716, the plot 716 ranges from the ion energy of IE51 to the ion energy of IE52 and has the ion flux value of IF5.

It should be noted that an ion energy band ranging from the ion energy IE51 to the ion energy IE52 is distinct from the ion energy band ranging from the ion energy 1E41 to the ion energy IE42. As an example, a majority of values of ion energy within the ion energy band ranging from the ion energy IE51 to the ion energy IE52 do not overlap with a majority of values of ion energy within the ion energy band ranging from the ion energy 1E41 to the ion energy IE42. To illustrate, less than 10% of values of ion energy within the ion energy band ranging from the ion energy IE51 to the ion energy IE52 are the same as less than 10% of values of ion energy within the ion energy band ranging from the ion energy 1E41 to the ion energy IE42. As another illustration, less than 25% of values of ion energy within the ion energy band ranging from the ion energy IE51 to the ion energy IE52 are the same as less than 25% of values of ion energy within the ion energy band ranging from the ion energy IE41 to the ion energy IE42. When the ion energy band ranging from the ion energy IE51 to the ion energy 1E52 is distinct from the ion energy band ranging from the ion energy IE41 to the ion energy IE42, the ion energies ranging from the ion energy IE41 to the ion energy IE42 is substantially exclusive of the ion energies ranging from the ion energy 1E51 to the ion energy IE52.

It should be noted that in some embodiments, a multistate bias voltage, described herein, provides various examples of the RF signal 102. For example, the bias voltage that transitions between 75 V and 8 V with the 10% duty cycle of the digital pulse signal DCS1 is the same as a voltage of the RF signal 102. As another example, the bias voltage that transitions between 100 V and 10 V with the 10% duty cycle of the digital pulse signal DCS1 is the same as a voltage of the RF signal 102. As yet another example, the bias voltage that transitions between 150 V and 10 V with the 10% duty cycle of the digital pulse signal DCS1 is the same as a voltage of the RF signal 102. As another example, the bias voltage that transitions between 200 V and 20 V with the 10% duty cycle of the digital pulse signal DCS1 is the same as a voltage of the RF signal 102.

It should be noted that with a reduction in a bias voltage for each state of the digital pulse signal DCS1, there is a narrower distribution of ion energy, which illustrates generation of a large number of monoenergetic ions for etching the material layer ML2 at a rate that is self-limiting without substantially etching the material layer ML1. For example, the plot 702 is generated when a first voltage of the RF signal 102 is optimized compared to a second voltage of the RF signal 102. The second voltage of the RF signal 102 is modified, such as changed or decreased, to the first voltage of the RF signal 102 to optimize the second voltage to achieve the first voltage. The second voltage of the RF signal 102 is supplied to generate the plot 704. For example, the parameter level PRL2 of 75 V used to generate the plot 702 is lower than the parameter level PRL2 of 100 V used to generate the plot 704. Also, the parameter level PRL1 of 8 V used to generate the plot 702 is lower than the parameter level PRL1 of 10 V used to generate the plot 704. The plot 702 has a narrower distribution of ion energy compared to the plot 704. For example, the FWHM 712 is narrower compared to an FWHM of the plot 704.

Continuing with the example, the plot 704 is generated when the second voltage of the RF signal 102 is optimized compared to a third voltage of the RF signal 102. The third voltage of the RF signal 102 is supplied to generate the plot 708. The third voltage of the RF signal 102 is modified, such as changed or decreased, to the second voltage of the RF signal 102 to optimize the third voltage to achieve the second voltage. For example, the parameter level PRL2 of 100 V used to generate the plot 704 is lower than the parameter level PRL2 of 150 V used to generate the plot 708. The plot 704 has a narrower distribution of ion energy compared to the plot 708. For example, the FWHM of the plot 704 is narrower compared to an FWHM of the plot 708.

Also, continuing with the example, the plot 708 is generated when the third voltage of the RF signal 102 is optimized compared to a fourth voltage of the RF signal 102. The fourth voltage of the RF signal 102 is modified, such as changed or decreased, to the third voltage of the RF signal 102 to optimize the fourth voltage to achieve the third voltage. The fourth voltage of the RF signal 102 is supplied to generate the plot 710. For example, the parameter level PRL2 of 150 V used to generate the plot 708 is lower than the parameter level PRL2 of 200 V used to generate the plot 710. The plot 708 has a narrower distribution of ion energy compared to the plot 710. For example, the FWHM of the plot 708 is narrower compared to an FWHM of the plot 710.

Figure 8:
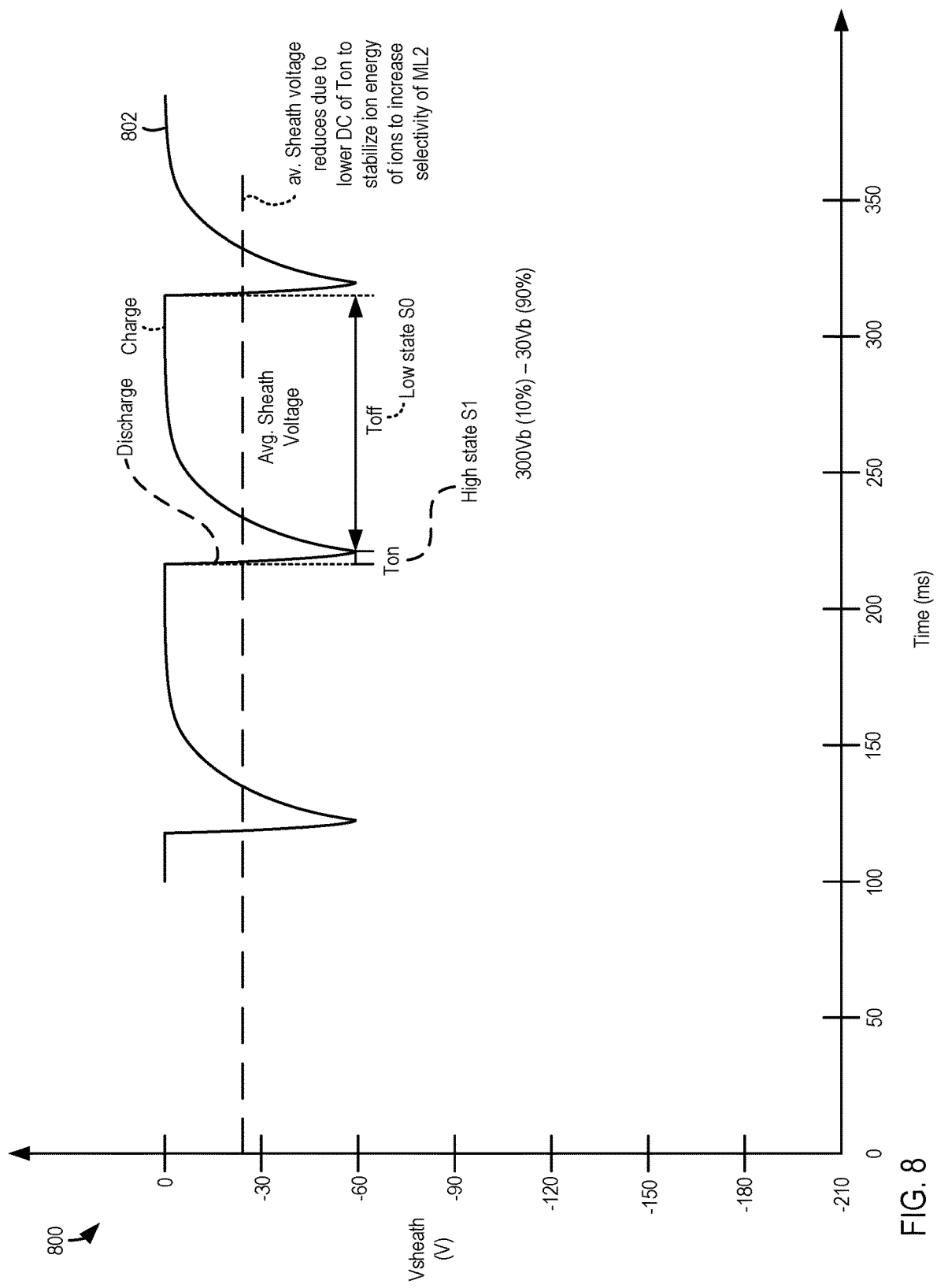
FIG. 8 is an embodiment of a graph to illustrate a relationship between a voltage of a plasma sheath of plasma formed within the plasma chamber and time.

FIG. 8 is an embodiment of a graph 800 to illustrate a relationship between a voltage of a plasma sheath of plasma formed within the plasma chamber and the time t, which is measured in microseconds (μs). The graph 800 has a plot 802, which illustrates charging and discharging of the plasma sheath with a change between the states S1 and S0 of the digital pulse signal DCS1 of FIG. 2. During the state S1 of the digital pulse signal DCS1, the plasma sheath is discharged quickly within a time period Ton and during the state S0 of the digital pulse signal DCS1, the plasma sheath charges within a time period Toff. Because the RF signal 102 of FIG. 1 is optimized with a reduction in the duty cycle DC1 and with a reduction in the parameter levels PRL1 and PRL2, average voltage of the plasma sheath is reduced over time. The reduction in the average voltage of the plasma sheath stabilizes ion energy of ions of plasma within the plasma chamber to increase selectivity of the material layer ML2 compared to the material layer ML1.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method comprising:
receiving by a computer, an identity of a first material layer of a substrate to be etched in a plasma chamber, the substrate having the first material layer and a second material layer, wherein the first material layer is disposed over the second material layer;
identifying, by the computer based on the identity of the first material layer, a first energy band optimized for etching the first material layer, wherein the first energy band is an extent of ion energy values at full width at half maximum of a functional relationship between ion flux and ion energy, wherein the first energy band is distinct from a second energy band optimized for etching the second material layer, wherein the first energy band is configured to etch the first material layer at a rate that is self-limiting to the second material layer so as to not substantially etch the second material layer;
controlling, by the computer, a radio frequency (RF) generator to generate a pulsed RF signal that pulses between a high parameter level and a low parameter level, wherein the pulsed RF signal has a duty cycle, wherein the pulsed RF signal is pulsed between the high parameter level and the low parameter level and has the duty cycle to generate plasma ions having ion energies within the first energy band;
determining, by the computer, whether a measured ion energy range is within a preset range from the first energy band; and
modifying, by the computer, the duty cycle upon determining that the measured ion energy range is not within the preset range from the first energy band, wherein said modifying the duty cycle occurs until the measured ion energy range is within the preset range from the extent of ion energy values at full width at half maximum of the functional relationship.

2. The method of claim 1, further comprising:
modifying the high parameter level to another high parameter level upon determining that the measured ion energy is not within the preset range from the first energy band.

3. The method of claim 2, further comprising modifying the low parameter level to another low parameter level upon determining that the measured ion energy is not within the preset range from the first energy band.

4. The method of claim 3, wherein the other low parameter level is 25 percent of the other high parameter level.

5. The method of claim 3, wherein other low parameter level is non-zero.

6. The method of claim 1, wherein said modifying the duty cycle is performed to output a modified duty cycle, wherein the modified duty cycle is approximately 25% or lower and the low parameter level has a magnitude that is approximately 25% or lower of a magnitude of the high parameter level.

7. The method of claim 1, wherein the rate is self-limiting to the second material layer to stop etching the second material layer when the second material layer is reached upon etching the first material layer.

8. The method of claim 1, wherein the first material layer is different from the second material layer.

9. The method of claim 1, wherein the first energy band is a first range of ion energies of the plasma ions, wherein the second energy band is a second range of ion energies, wherein the first range of ion energies is substantially exclusive of the second range of ion energies.

10. The method of claim 1, further comprising:
receiving a measurement of a wafer bias at a chuck of the plasma chamber;
receiving a measurement of a voltage;
determining the measured ion energy from the wafer bias and the voltage.

11. The method of claim 10, wherein the wafer bias is measured at the chuck by a probe and a wafer bias sensor, wherein the voltage is measured by a voltage sensor.

12. The method of claim 1, wherein the first energy band is an ion energy band and the second energy band is an ion energy band.

13. The method of claim 1, wherein the duty cycle is modified to output a modified duty cycle, wherein the first energy band is associated with a value of the ion flux, the method further comprising:
- determining a measured ion flux associated with the plasma chamber;
- determining whether the measured ion flux is within a preset range from the value of ion flux associated with the first energy band; and
- adjusting the modified duty cycle upon determining that the measured ion flux is outside the preset range from the value of ion flux associated with the first energy band.

\* \* \* \* \*